US012373343B2

(12) United States Patent
Botimer et al.

(10) Patent No.: US 12,373,343 B2
(45) Date of Patent: Jul. 29, 2025

(54) INTER-LAYER COMMUNICATION TECHNIQUES FOR MEMORY PROCESSING UNIT ARCHITECTURES

(71) Applicant: MemryX Incorporated, Ann Arbor, MI (US)

(72) Inventors: Jacob Botimer, Ann Arbor, MI (US); Mohammed Zidan, Ann Arbor, MI (US); Chester Liu, Ann Arbor, MI (US); Timothy Wesley, Ann Arbor, MI (US); Wei Lu, Ann Arbor, MI (US)

(73) Assignee: MemryX Incorporated, Ann Arbor, MI (US)

( * ) Notice: Subject to any disclaimer, the term of this patent is extended or adjusted under 35 U.S.C. 154(b) by 0 days.

(21) Appl. No.: 17/943,143

(22) Filed: Sep. 12, 2022

(65) Prior Publication Data

US 2023/0061711 A1 Mar. 2, 2023

Related U.S. Application Data

(63) Continuation of application No. PCT/US2021/048548, filed on Aug. 31, 2021.

(60) Provisional application No. 63/072,904, filed on Aug. 31, 2020.

(51) Int. Cl.
| | |
|---|---|
| *G06F 3/06* | (2006.01) |
| *G06F 9/46* | (2006.01) |
| *G06F 12/02* | (2006.01) |
| *G06F 12/06* | (2006.01) |
| *G06N 3/045* | (2023.01) |
| *G06N 3/063* | (2023.01) |
| *G11C 11/54* | (2006.01) |

(52) U.S. Cl.
CPC ........ *G06F 12/0607* (2013.01); *G06F 3/0611* (2013.01); *G06F 3/0659* (2013.01); *G06F 3/0673* (2013.01); *G06F 9/46* (2013.01); *G06F 12/0238* (2013.01); *G06N 3/045* (2023.01); *G06N 3/063* (2013.01); *G11C 11/54* (2013.01)

(58) Field of Classification Search
CPC .... G06F 12/0607; G06F 17/16; G06F 3/0611; G06F 3/0659; G06F 3/0673; G06F 9/46
See application file for complete search history.

(56) References Cited

U.S. PATENT DOCUMENTS

2019/0041952 A1* 2/2019 Alameldeen ............ G06F 1/329

* cited by examiner

*Primary Examiner* — Yong J Choe

(57) ABSTRACT

A memory processing unit (MPU) can include a first memory, a second memory, a plurality of processing regions and control logic. The first memory can include a plurality of regions. The plurality of processing regions can be interleaved between the plurality of regions of the first memory. The processing regions can include a plurality of compute cores. The second memory can be coupled to the plurality of processing regions. The control logic can configure data flow between compute cores of one or more of the processing regions and corresponding adjacent regions of the first memory. The control logic can also configure data flow between the second memory and the compute cores of one or more of the processing regions. The control logic can also configure data flow between compute cores within one or more respective ones of the processing regions.

10 Claims, 30 Drawing Sheets

Output Feature Map

Output Channels

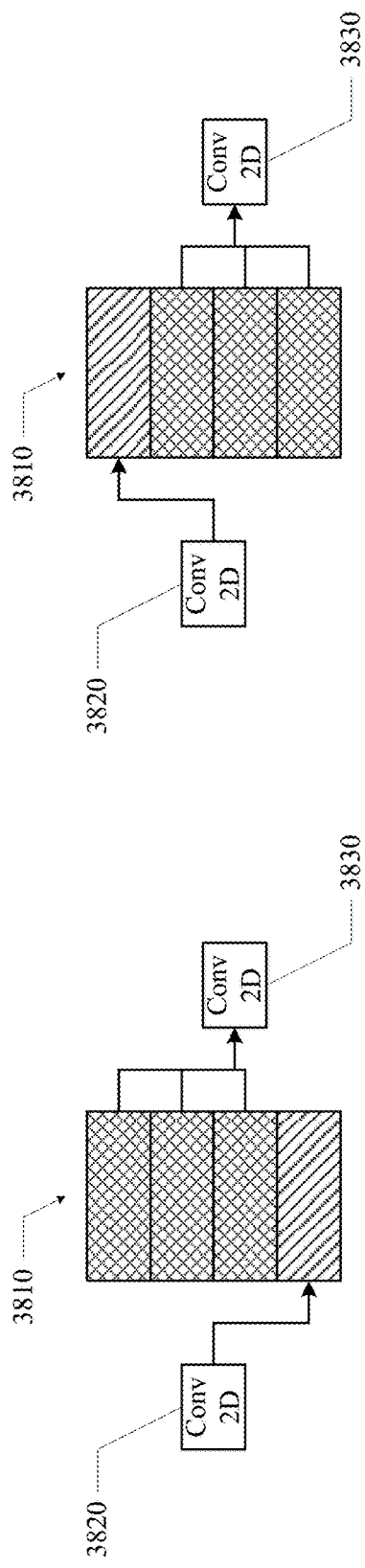
FIG. 38A
FIG. 38B
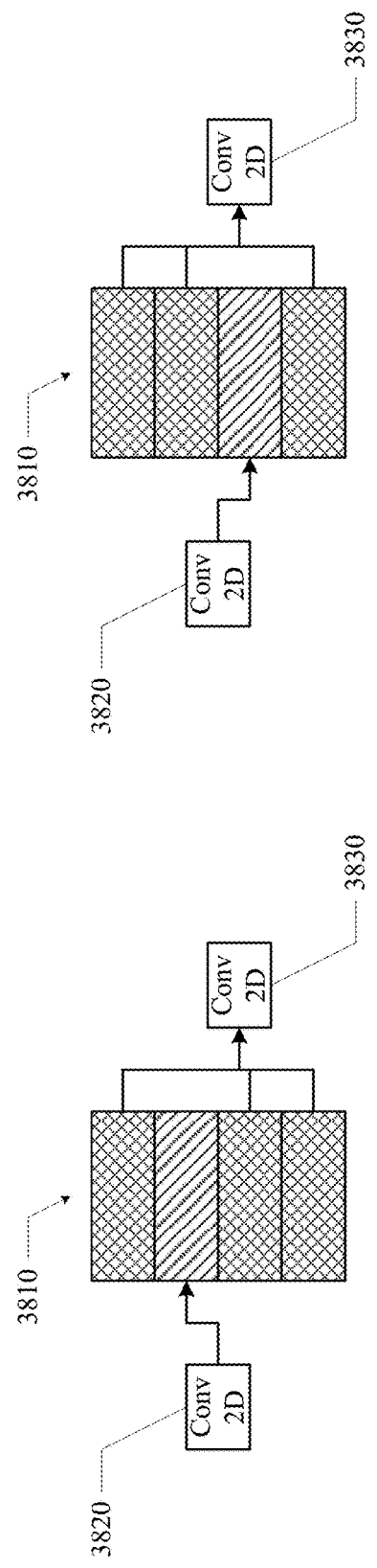
FIG. 38C
FIG. 38D

INTER-LAYER COMMUNICATION TECHNIQUES FOR MEMORY PROCESSING UNIT ARCHITECTURES

CROSS-REFERENCE TO RELATED APPLICATIONS

This application is a continuation of PCT Patent Application No. PCT/US2021/048548 filed Aug. 31, 2021, and claims the benefit of U.S. Provisional Patent Application No. 63/072,904 filed Aug. 31, 2020, which are incorporated herein in their entirety.

BACKGROUND OF THE INVENTION

Computing systems have made significant contributions toward the advancement of modern society and are utilized in a number of applications to achieve advantageous results. Applications such as artificial intelligence, machine learning, big data analytics and the like perform computations on large amounts of data. In conventional computing systems, data is transferred from memory to one or more processing units, the processing units perform calculations on the data, and the results are then transferred back to memory. The transfer of large amounts of data from memory to the processing unit and back to memory takes time and consumes power. Accordingly, there is a continuing need for improved computing systems that reduce processing latency, data latency and or power consumption.

SUMMARY OF THE INVENTION

The present technology may best be understood by referring to the following description and accompanying drawings that are used to illustrate embodiments of the present technology directed toward inter-layer communication techniques for memory processing architectures.

In one embodiment, a memory processing unit (MPU) can include a first memory, a plurality of processing regions and one or more inter-layer communication (ILC) modules. The first memory can include a plurality of regions. The plurality of processing regions can be interleaved between the plurality of regions of the first memory. The processing regions can include a plurality of compute cores, wherein each of the plurality of compute cores of each respective one of the plurality of processing regions are coupled between adjacent ones of the first plurality of memory regions. The one or more ILC modules can be communicatively coupled to the plurality of compute cores in each of the plurality of processing regions, wherein the one or more ILC modules are configurable to control communication between compute cores through corresponding adjacent ones of the plurality of regions of the first memory.

In another embodiment, a memory processing unit (MPU) inter-layer communication method can include receiving synchronization commands from respective compute cores. The synchronization commands are related to access requests (e.g., read/write) by compute cores to buffers of respective ones of the plurality of regions of the first memory, wherein the buffers are shared memory regions between producer and consumer compute cores. The accesses to the respective buffers of respective ones of the plurality of regions of the first memory can be tracked. Access to the buffers of the respective one of the plurality of regions of the first memory by the respective compute cores can be controlled based on the respective read and write access tracking associated with the buffers of the respective one of the plurality of regions of the first memory.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIGS. 38A-38D illustrate an exemplary shared partial buffer for a 3×3 kernel size, in accordance with aspects of the present technology.

DETAILED DESCRIPTION OF THE INVENTION

Figure 1:
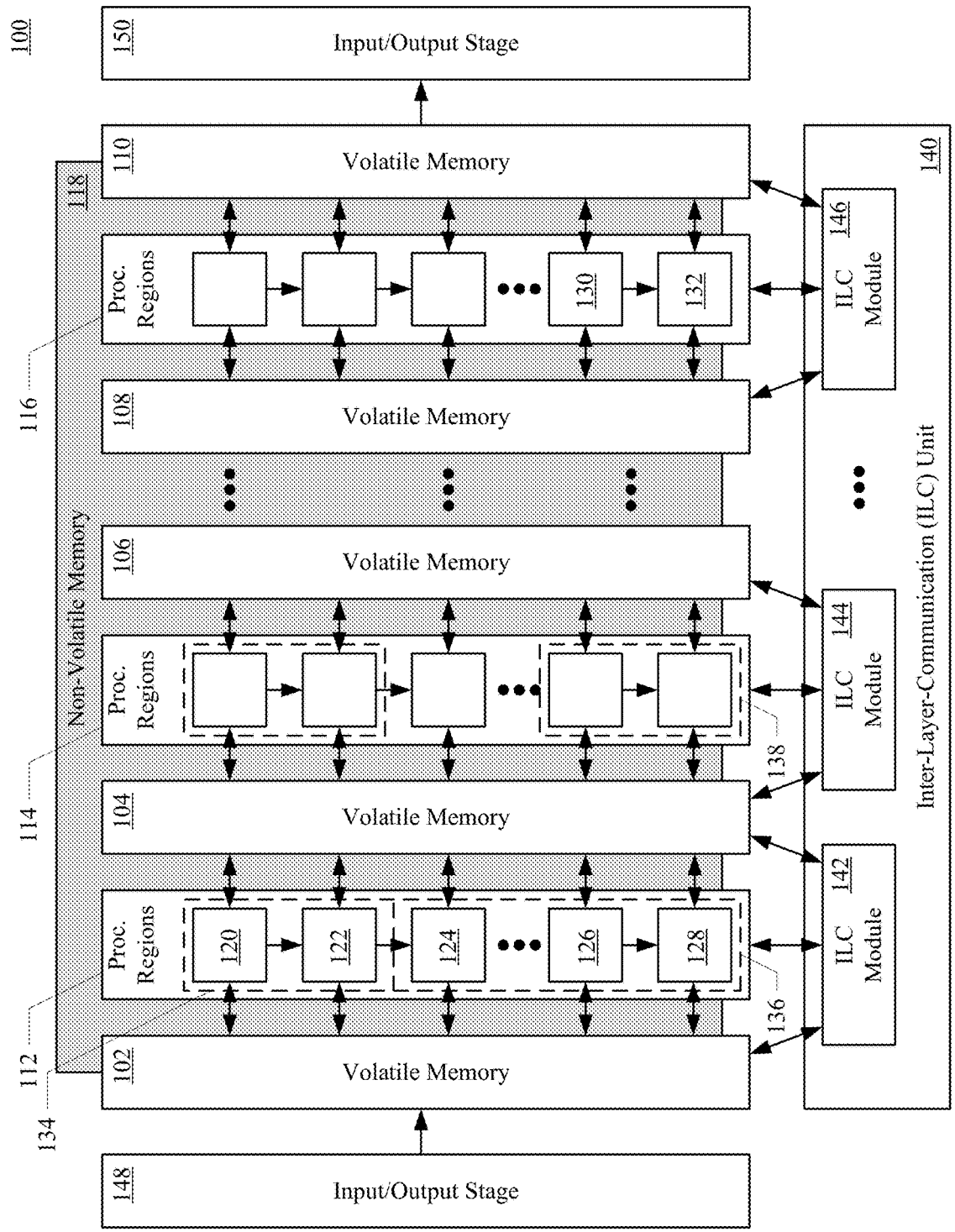
FIG. 1 shows a memory processing unit (MPU), in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the term "and or" includes any and all combinations of one or more of the associated elements. It is also to be understood that the phraseology and terminology used herein is for the purpose of description and should not be regarded as limiting.

Referring to FIG. 1, a memory processing unit (VIPU), in accordance with aspects of the present technology, is shown. The memory processing unit 100 can include a first memory including a plurality of regions 102-110, a plurality of processing regions 112-116 and a second memory 118. The second memory 118 can be coupled to the plurality of processing regions 112-116. The second memory 118 can optionally be logically or physically organized into a plurality of regions. The plurality of regions of the second memory 118 can be associated with corresponding ones of the plurality of processing region 112-116. In addition, the plurality of regions of the second memory 118 can include a plurality of blocks organized in one or more macros. The first memory 102-110 can be volatile memory, such as static random-access memory (SRAM) or the like. The second memory can be non-volatile memory or volatile memory, such as resistive random-access memory (RRAM), magnetic random-access memory (MRAM), flash memory (FLASH), SRAM or the like.

The plurality of processing regions 112-116 can be interleaved between the plurality of regions of the first memory 102-110. The processing regions 112-116 can include a plurality of computer cores 120-132. The plurality of compute cores 120-132 of respective ones of the plurality of processing regions 112-116 can be coupled between adjacent ones of the plurality of regions of the first memory 102-110. For example, the compute cores 120-128 of a first processing region 112 can be coupled between a first region 102 and a second region 104 of the first memory 102-110. The compute cores 120-132 in each respective processing region 112-116 can be configurable in one or more clusters 134-138. For example, a first set of compute cores 120, 122 in a first processing region 112 can be configurable in a first cluster 134. Similarly, a second set of compute cores 124-128 in the first processing region can be configurable in a second cluster 136. The plurality of compute cores 120-132 of respective ones of the plurality of processing regions 112-116 can also be configurably couplable in series. For example, a set of computer cores 120-124 in a first processing region 112 can be communicatively coupled in series, with a second compute core 122 receiving data and or instructions from a first compute core 120, and a third compute core 124 receiving data and or instructions from the second compute core 122.

The memory processing unit 100 can further include an inter-layer-communication (ILC) unit 140. The ILC unit 140 can be global or distributed across the plurality of processing regions 112-116. In one implementation, the ILC unit 140 can include a plurality of ILC modules 142-148, wherein each ILC module can be coupled to a respective processing regions 112-116. Each ILC module can also be coupled to the respective regions of the first memory 102-110 adjacent the corresponding respective processing regions 112-116. The inter-layer-communication unit 140 can be configured to synchronize data movement between one or more compute cores producing given data and one or more other compute cores consuming the given data.

The memory processing unit 100 can further include one or more input/output stages 142, 144. The one or more input/output stages 142, 144 can be coupled to one or more respective regions of the first memory 102-110. The one or more input/output stages 142, 144 can include one or more input ports, one or more output ports, and or one or more input/output ports. The one or more input/output stages 142, 144 can be configured to stream data into or out of the memory processing unit 100. For example, one or more of the input/output (I/O) cores can be configured to stream data into a first one of the plurality of regions of the first memory 102-110. Similarly, one or more input/output (I/O) cores can be configured to stream data out of a last one of the plurality of regions of the first memory 102-110.

The plurality of processing regions 112-116 can be configurable for memory-to-core dataflow from respective ones of the plurality of regions of the first memory 102-110 to one or more cores 120-132 within adjacent ones of the plurality of processing regions 112-116. The plurality of processing regions 112-116 can also be configurable for core-to-memory dataflow from one or more cores 120-132 within ones of the plurality of processing regions 112-116 to adjacent ones of the plurality of regions of the first memory 102-110. In one implementation, the dataflow can be configured for a given direction from given ones of the plurality of regions of the first memory 102-110 through respective ones of the plurality of processing regions to adjacent ones of the plurality of regions of the first memory 102-110. For example, The plurality of processing regions 112-116 can also be configurable for memory-to-core data flow from the second memory 118 to one or more cores 120-132 of corresponding ones of the plurality of processing regions 112-116. If the second memory 118 is logically or physically organized in a plurality of regions, respective ones of the plurality of regions of the second memory 118 can be configurably couplable to one or more compute cores in respective ones of the plurality of processing regions 112-116.

The plurality of processing regions 112-116 can be further configurable for core-to-core data flow between select adjacent compute cores 120-132 in respective ones of the plurality of processing regions 112-116. For example, a given core 124 can be configured to pass data accessed from an adjacent portion of the first memory 102 with one or more other cores 126-128 configurably coupled in series with the given compute core 124. In another example, a given core 120 can be configured to pass data access from the second memory 118 with one or more other cores 122 configurably coupled in series with the given compute core 120. In yet another example, a given compute core 120 can pass a result, such as a partial sum, computed by the given compute core 120 to one or more other cores 122 configurably coupled in series with the given compute core 120.

The plurality of processing regions 112-116 can include one or more near memory (M) cores. The one or more near memory (M) cores can be configurable to compute neural network functions. For example, the one or more near memory (M) cores can be configured to compute vector-vector products, vector-matrix products, matrix-matrix products, and the like, and or partial products thereof.

The plurality of processing regions 112-116 can also include one or more arithmetic (A) cores. The one or more arithmetic (A) cores can be configurable to compute arithmetic operations. For example, the arithmetic (A) cores can be configured to compute merge operation, arithmetic calculation that are not supported by the near memory (M) cores, and or the like.

The plurality of the inputs and output regions 142, 144 can also include one or more input/output (I/O) cores. The one or more input/output (I/O) cores can be configured to access input and or output ports of the memory processing unit (MPU) 100. The term input/output (I/O) core as used herein can refer to cores configured to access input ports, cores configured to access output ports, or cores configured to access both input and output ports.

The compute cores 120-132 can include a plurality of physical channels configurable to perform computations, accesses and the like simultaneously with other cores within respective processing regions 112-116, and or simultaneously with other cores in other processing regions 112-116. The compute cores 120-132 of respective ones of the plurality of processing regions 112-116 can be associated with one or more blocks of the second memory 118. The compute cores 120-132 of respective ones of the plurality of processing regions 112-116 can be associated with respective slices of the second plurality of memory regions. The cores 120-132 can include a plurality of configurable virtual channels.

As further described below, the memory processing unit 100 can advantageously provide simple dataflow without a centralized control unit. The memory processing unit 100 can also advantageously implement immersed in-memory computing. The memory processing unit 100 can also advantageously reduce off-chip data communications. The memory processing unit 100 can also advantageously increase data reuse. The memory processing unit 100 can also be configured utilizing offline programming.

Figure 2:
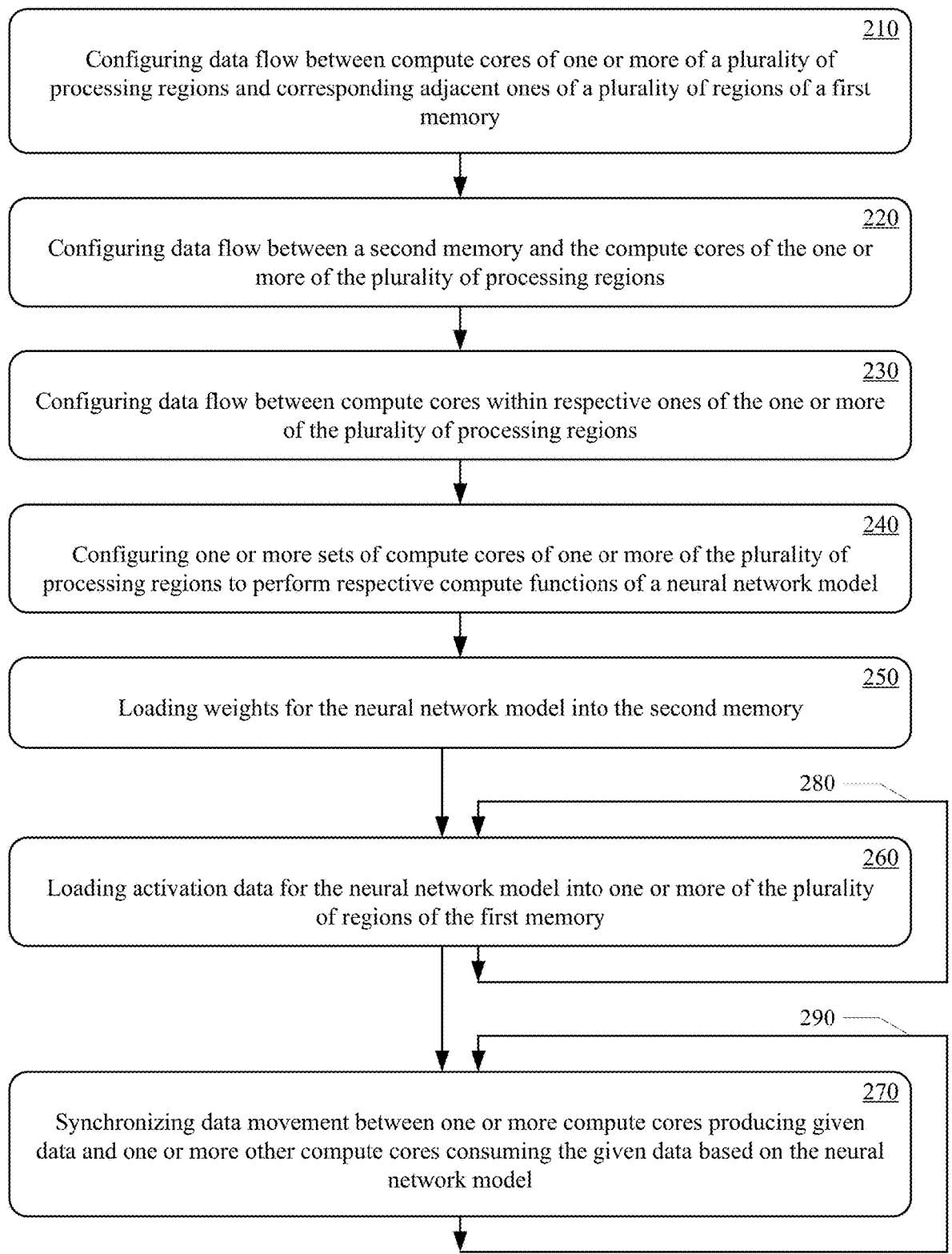
FIG. 2 shows a memory processing method, in accordance with aspects of the present technology.

Referring now to FIG. 2, a memory processing method, in accordance with aspects of the present technology, is shown. The method will be explained with reference to the memory processing unit 100 of FIG. 1. The method can include configuring data flow between compute cores of one or more of a plurality of processing regions 112-116 and corresponding adjacent ones of the plurality of regions of the first memory, at 210. At 220, data flow between the second memory 118 and the compute cores 120-132 of the one or more of the plurality of processing regions 112-116 can be configured. At 230, data flow between compute cores 120-132 within respective ones of the one or more of the plurality of processing regions 112-116 can be configured. Although the processes of 210-240 are illustrated as being performed in series, it is appreciated that the processes can be performed in parallel or in various combinations of parallel and sequential operations.

At 240, one or more sets of compute cores 120-132 of one or more of the plurality of processing regions 112-116 can be configured to perform respective compute functions of a neural network model. At 250, weights for the neural network model can be loaded into the second memory 118. At 260, activation data for the neural network model can be loaded into one or more of the plurality of regions of the first memory 102-110.

At 270, data movement between one or more compute cores producing given data and one or more other compute cores consuming the given data can be synchronized based on the neural network model. The synchronization process can be repeated at 280 for processing the activation data of the neural network model. The synchronization process can include synchronization of the loading of the activation data of the neural network model over a plurality of cycles, at 290.

Referring again to FIG. 1, the inter-layer-communication unit 140 can be configured to synchronize data movement between one or more compute cores producing given data and one or more other compute cores consuming the given data. Data communication within the memory processing unit 100 can include direct and indirect connections between two modules. Direct synchronization can be implemented by direct wire connections with a producer/consumer handshake. The direct synchronization can be implemented by polymorphic connections between compute cores.

The inter-layer-communication unit 140 can also synchronize indirect connections between two modules. Indirect synchronization can be implemented by use of a buffer between two modules. Indirect synchronization by the inter-layer-communication unit 140 can be implemented as communication between compute cores and volatile memory (e.g., SRAM). In such an implementation, a producer compute core can write to a shared buffer in a corresponding first memory region 104 and a consumer compute core can read from the shared buffer. The data can be synchronized to avoid data hazards that can occur in the buffer. Exemplary data hazards can include a producer core overwriting data to a buffer before a consumer core can read data from the buffer, or a consumer core reading data from a buffer before the producer core can write the data to the buffer. In one implementation, indirect synchronization can be implemented by the compute cores sending appropriate signals to the buffer to provide visible synchronization. In visible indirect synchronization, the buffers between the compute cores can act as a simple memory used for writing and reading data. The producer core can be configured to ensure that the consumer core is ready for data, and the consumer core can be configured to ensure that there is enough data in the memory so that it can perform a computation operation.

In another implementation, indirect synchronization can be implemented by the ILC unit to provide invisible synchronization. In the invisible indirect synchronization the ILC unit is responsible for keeping producer compute cores and consumer compute cores in synchronization.

Figure 3:
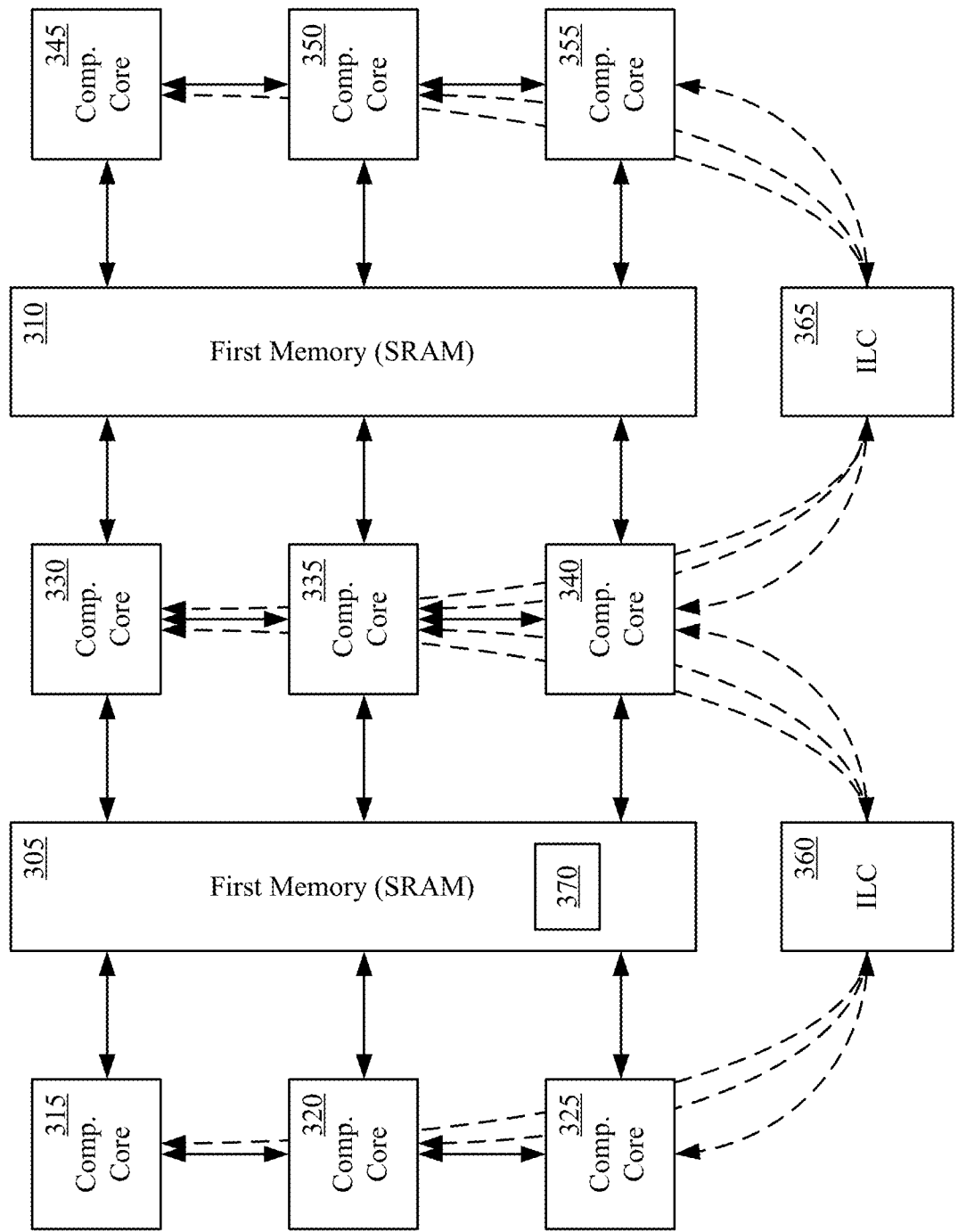
FIG. 3 shows a memory processing unit, in accordance with aspects of the present technology.

Referring now to FIG. 3, a memory processing unit (VIPU), in accordance with aspects of the present technology, is shown. The memory processing unit 100 can include a first memory including a plurality of regions 305-310, a plurality of compute cores 315-355 organized in a plurality of processing regions, a second memory (not shown) and an inter-layer-communication (ILC) unit 360-365. The memory processing unit MPU can be arranged as described above with reference to FIGS. 1 and 2. In one implementation, the layer-communication (ILC) unit 360-365 can include a plurality of layer-communication (ILC) modules, wherein each layer-communication (ILC) module 360, 365 controls data movement through a corresponding regions of the first memory 305, 310, between one or more compute cores producing given data and one or more other compute cores consuming the given data.

In one implementation, data flow between compute cores 315-325 of one or more of a plurality of processing regions and corresponding adjacent ones of the plurality of regions of the first memory 305 can be configured utilizing direct synchronization between the compute cores and the first memory. Similarly, data flow between the second memory (not shown) and the compute cores 315-355 of the one or more of the plurality of processing regions can be configured utilizing direct synchronization between the compute cores 315-355 and the second memory. Data flow between compute cores 315-325 within respective ones of the one or more of the plurality of processing regions can also be configured utilizing direct synchronization between adjacent compute cores within the respective processing region.

Figure 4:
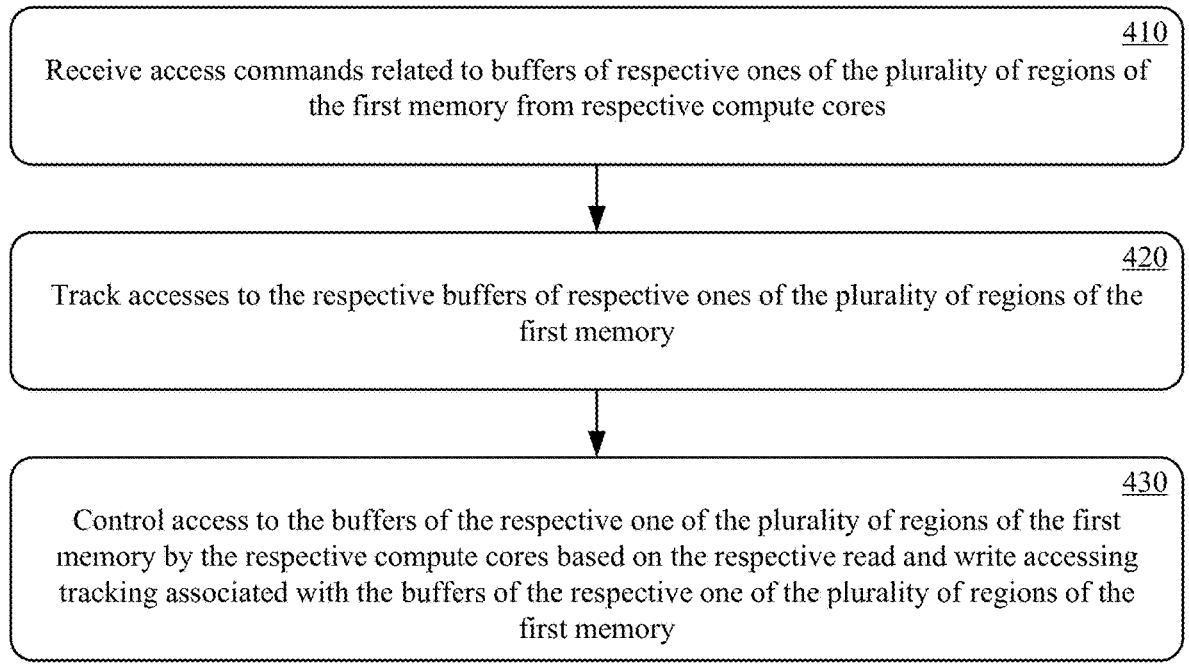
FIG. 4 shows an inter-layer-communication method, in accordance with aspect of the present technology.

The inter-layer-communication (ILC) unit 360-365 can synchronize data movement between one or more compute cores 315-325 producing given data and one or more other compute cores 330-340 consuming the given data utilizing indirect invisible synchronization. Data movement synchronization by the inter-layer-communication (ILC) unit 360-365 will be further described with reference to FIGS. 4-6. Referring now to FIG. 4, an inter-layer-communication method, in accordance with aspect of the present technology, is shown. The inter-layer-communication (ILC) unit 360-365 can be configured to receive synchronization commands related to respective buffers 370 of respective ones of the plurality of regions of the first memory 305 from respective compute cores 315-355 of the plurality of processing regions, at 410. For example, inter-layer-communication (ILC) unit 360-365 can receive synchronization commands from a first one 320 of the plurality of compute cores 315-355 related to writing data to a shared buffer 370 in a first portion of the first memory 305. In one implementation, a producer compute core can send an increment synchronization command when it finishes writing a whole feature-memory row to the buffer. The inter-layer-communication (ILC) unit 360-365 can also receive access commands from a second one 330 of the plurality of compute cores 315-355 related to reading data from the shared buffer 370 in a first portion of the first memory 305. In one implementation, a consumer compute core can send a decrement synchronization command when it finishes reading a whole feature-memory row from the buffer.

At 420, the inter-layer-communication (ILC) unit 360-365 can track read and write accesses to the respective buffers of respective ones of the plurality of regions of the first memory. In one implementation tracking is done on a coarse grain level, such as a whole feature-map row level. In one implementation, the inter-layer-communication (ILC) unit 360-365 can track access to respective buffers with corresponding respective indexes to point to an ILC entry. The inter-layer-communication (ILC) unit 360-365 does not need to store buffer region boundaries or other information about the buffer. Instead, the compute cores 315-355 can be responsible for accessing the correct ILC entry index that corresponds to a respective shared buffer. In one implementation, an identifier of a given compute core 320 received in an synchronization command can be mapped to a count associated with a given region (e.g., buffer) of a given portion of the first memory 305.

Figure 5:
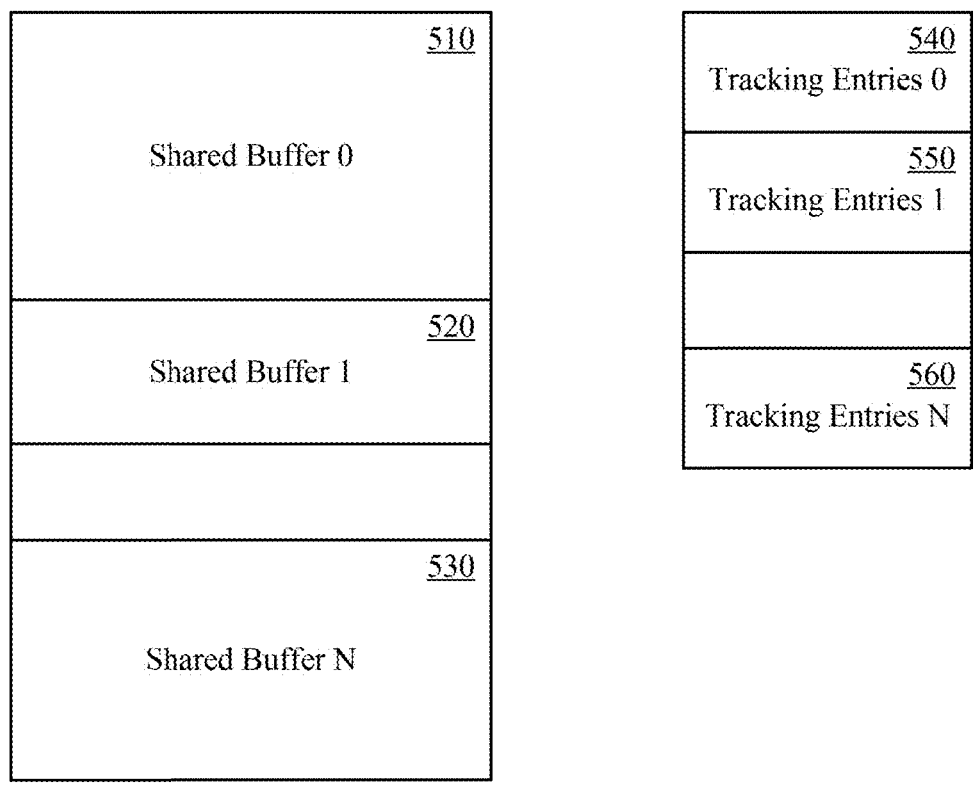
FIG. 5 shows respective shared buffers and corresponding respective ILC entry indexes, in accordance with aspects of the present technology.

Referring now to FIG. 5, respective shared buffers 510-530 and corresponding respective ILC entry indexes 540-560, in accordance with aspects of the present technology, are shown. Each ILC entry index can include a count of the number of synchronization units that one or more producer compute cores have produced (e.g., written) to the corresponding respective shared buffer, and one or more consumer compute cores have yet to consume (e.g., read) from the corresponding respective shared buffer. In one implementation, the ILC entry index can include a current unit count ($i_c$), a maximum count ($i_x$), a minimum count ($i_y$), and an initial count ($i_o$).

Figure 6:
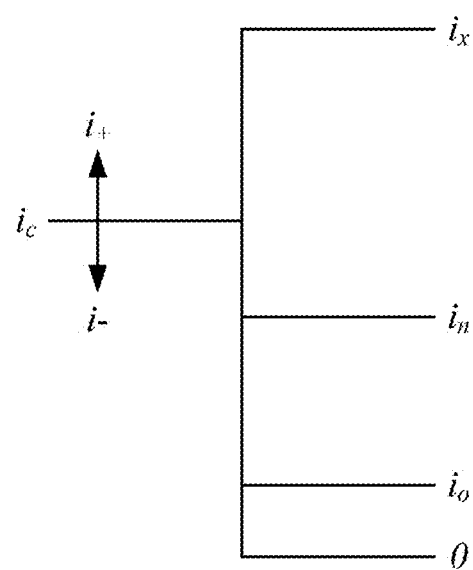
FIG. 6 illustrates tracking of access to a shared respective buffer in a respective ILC entry index, in accordance with aspects of the present technology.

At 430, the inter-layer-communication (ILC) unit 360-365 can control access to the buffers of the respective one of the plurality of regions of the first memory 350, 310 by the respective compute cores 315-355 based on the respective read and write accessing tracking associated with the buffers. In one implementation, the inter-layer-communication (ILC) unit 360-365 can allow or block requests to a corresponding respective shared buffer 370 from one or more respective producer compute cores 320 and one or more respective consumer compute cores 340 based on the corresponding ILC entry index. For example, the inter-layer-communication (ILC) unit 360-365 can allow write access to a respective shared buffer 370 as long as the current unit count ($i_c$) in the corresponding ILC entry index is less than the maximum count ($i_x$). If the given write access is allowed, the inter-layer-communication (ILC) unit 360-365 increments the current unit count ($i_c$) by an amount of units ($i_+$) for the given write access, as illustrated in FIG. 6. If the current unit count ($i_c$) in the corresponding ILC entry index is greater than or equal to the maximum count ($i_x$), the inter-layer-communication (ILC) unit 360-365 blocks the given write access to the respective shared buffer 370, and does not increment the current unit count ($i_c$). Similarly, the inter-layer-communication (ILC) unit 360-365 can allow read access to a respective shared buffer 370 as long as the current unit count ($i_c$) in the corresponding ILC entry index is greater than the minimum count ($i_n$). If the given read access is allowed, the inter-layer-communication (ILC) unit 360-365 decrements the current unit count ($i_c$) by an amount of units ($i_-$) for the given read access. If the current unit count ($i_c$) in the corresponding ILC entry index is less than or equal to the minimum count ($i_n$), the inter-layer-communication (ILC) unit 360-365 blocks the given read access to the respective shared buffer 370, and does not decrement the current unit count ($i_c$). The difference between the initial count ($i_o$) and the minimum count ($i_n$) represents the amount of data that must be produced (written to the corresponding shared buffer) by one or more producer compute cores before one or more consumer compute cores may start to consume data from the corresponding shared buffer. If there are multiple producer compute cores writing to the same shared buffer, the inter-layer-communication (ILC) unit 360-365 may require multiple increment synchronization commands for the compute cores before incrementing the current unit count ($i_c$). Furthermore, the inter-layer-communication (ILC) unit 360-365 may need to know from the corresponding computer core when a new data set, such as a new feature map, is received to reset the counter values. Similarly, as compute cores reach the end of a data set, such as a feature map, as indicated by the current unit count ($i_c$) reaching a "o" value, the inter-layer-communication (ILC) unit 360-365 can consider the next write command to be the start of a new data set, such as a feature map frame.

Figure 7:
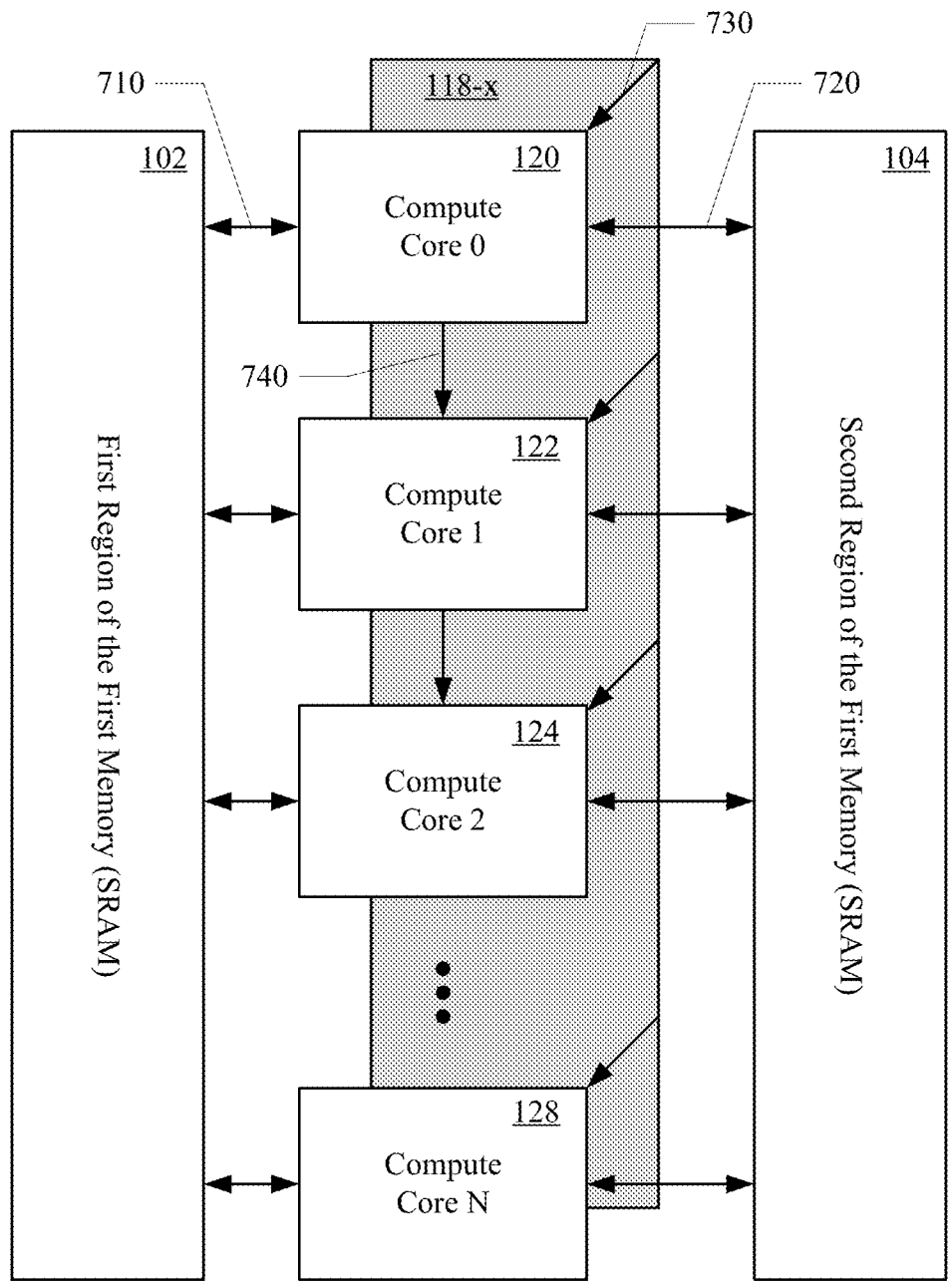
FIG. 7 shows configuration of dataflows in the memory processing unit, in accordance with aspects of the present technology.

Referring now to FIG. 7, configuration of dataflows in the memory processing unit, in accordance with aspects of the present technology, is illustrated. The dataflow 710, 720 between the compute cores 120-128 of the processing regions and adjacent portions of first memory region 102, 104 can be configured in either direction. For example, the compute cores 120-128 and the adjacent portions of the first memory region 102, 104 can be configured for dataflow from a first portion of the first memory region 102, through the compute cores 120-128, and to a second portion of the first memory region 104. Alternatively, the dataflow can be configured from the second portion of the first memory region 104, through the compute cores 120-128, to the first portion of the first memory region 102. In one implementation, the dataflow between the compute cores 120-128 of the processing regions and adjacent portions of first memory region 102, 104 can provide a direct route to access feature map data or the like.

The dataflow 730 from the second memory region 118 to the compute cores of the processing regions can also be configured. In one implementation, the dataflow from the second memory region 118 to the compute cores 120-128 can provide a direct route to access kernel data, weight data or the like. The dataflow 740 between the compute cores 120-128 can also be configured. In one implementation, the dataflow between the compute cores 120-128 can provide for the sharing of data from the second memory region with others of the compute cores 120-128 in a corresponding processing region. In another implementation, the dataflow between the compute cores 120-128 can provide for the sharing of data from an adjacent portion of the first memory region. In yet another implementation, the dataflow between compute cores 120-128 can provide for passing compute result data sequentially to other of the compute cores 120-128 in a corresponding processing region. For example, dataflow between the compute cores 120-128 can be configured to sequentially pass partial sum data to adjacent ones of the compute cores 120-128.

Figure 8A:
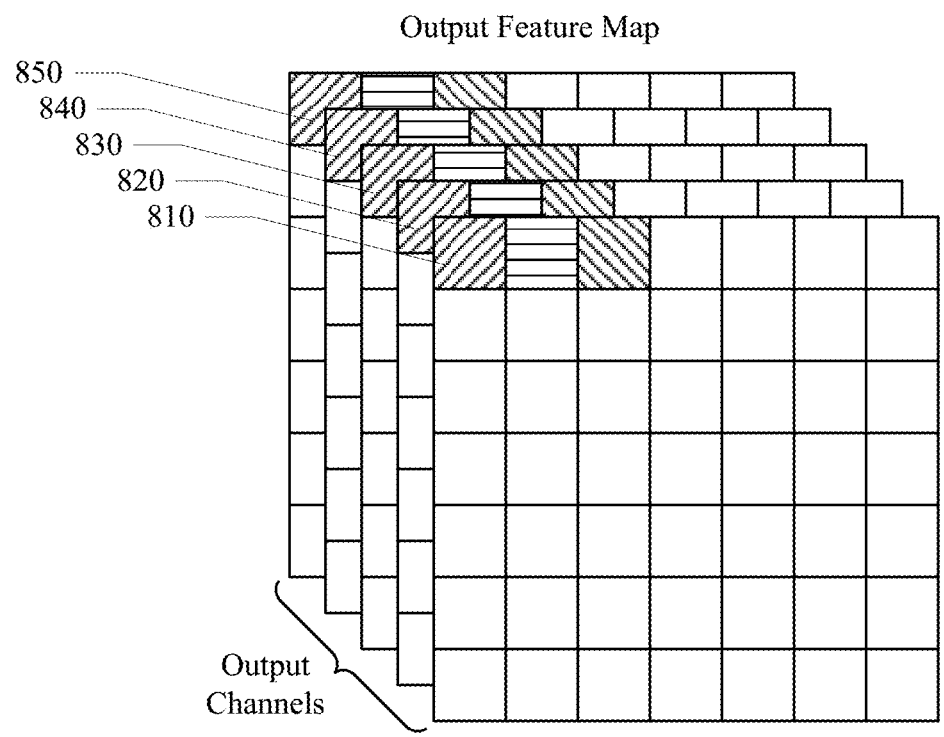
FIGS. 8A-8C show an exemplary computation of multiple output feature map pixels, in accordance with aspects of the present technology.
Figure 8B:
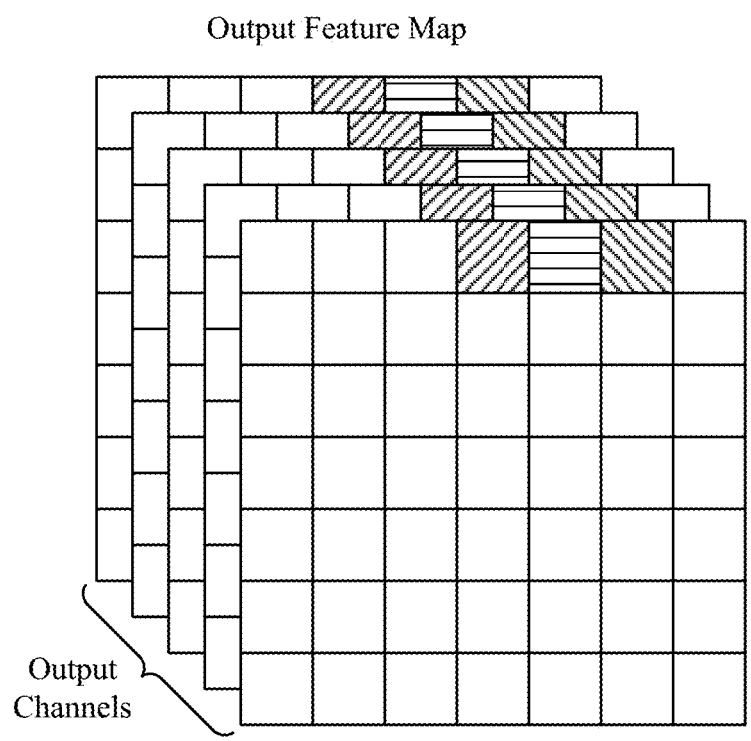
Figure 8C:
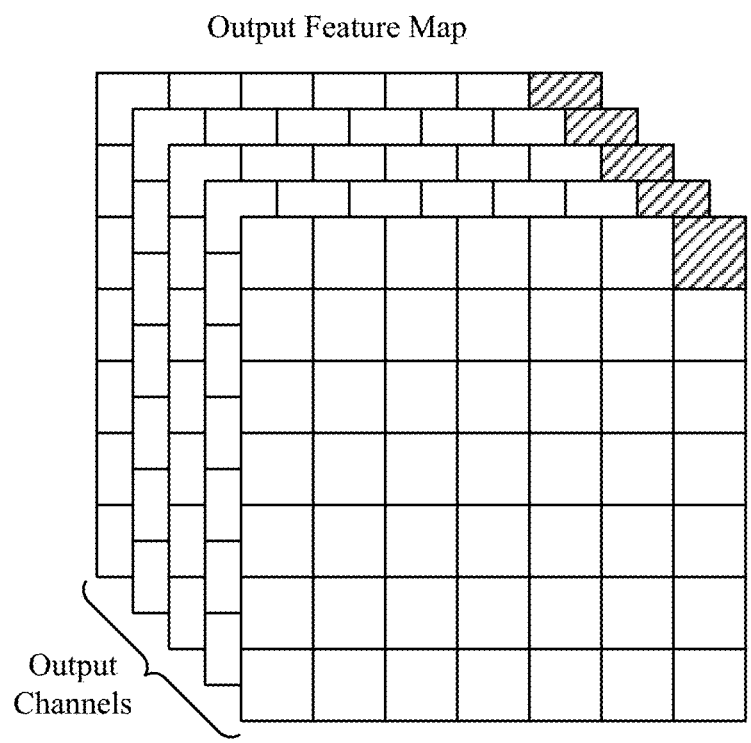

Referring now to FIGS. 8A-8C, an exemplary computation of multiple output feature map pixels, in accordance with aspects of the present technology, is illustrated. One or more compute cores can be configured to compute a corresponding output feature map pixel from an input feature map pixel value and a kernel data (weight) value. As illustrated, compute cores can be configured as three pixel workers to compute output feature map pixel values for each of the output channels. For example, a given pixel worker can compute output feature map pixel values 810-850 for each of the output channels of the output feature map. The pixel workers can then step to the next set of three pixel values to compute the corresponding output channels of the output feature map, as illustrated in FIG. 8B. In a polymorphic implementation, multiple compute cores can work together as pixel workers. The maximum number of pixel workers for a given layer is limited to the output feature map width of the given layer. The kernel, weight data or the like can be reused without reloading them from the second memory region.

Figure 9:
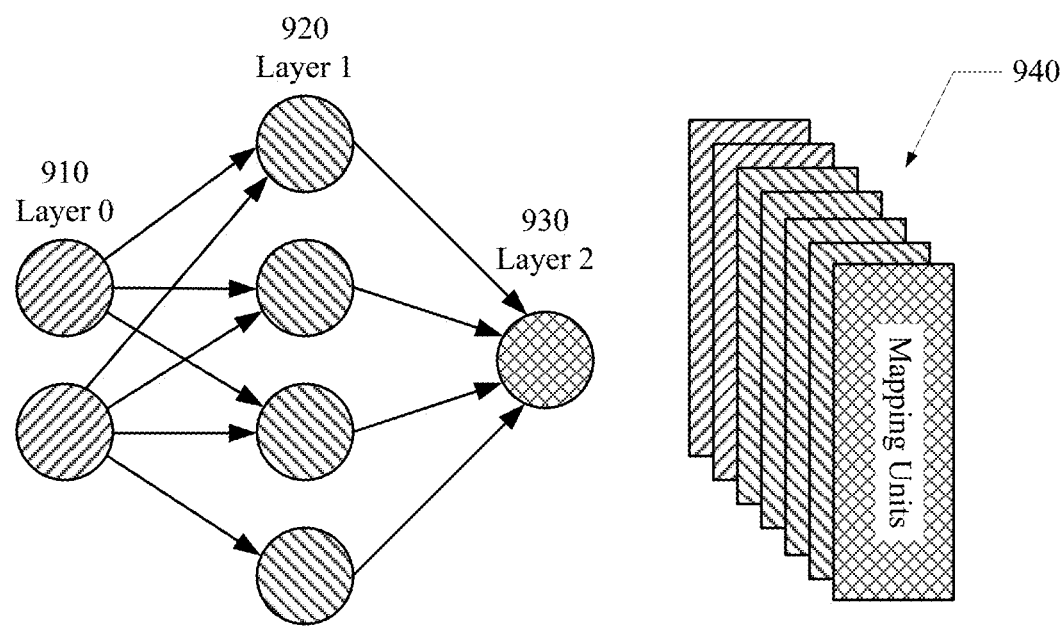
FIG. 9 illustrates an exemplary mapping unit for a neural network, in accordance with aspects of the present technology.
Figure 10:
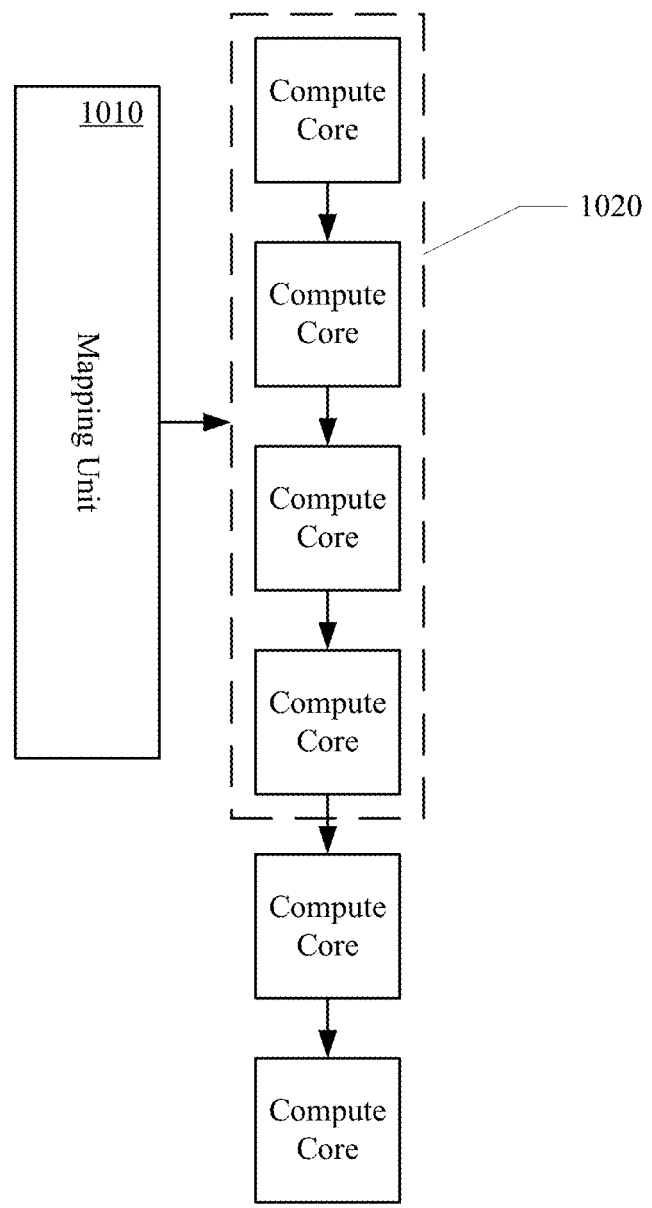
FIG. 10 illustrates an exemplary compute core for a mapping unit, in accordance with aspects of the present technology.

In accordance with aspects of the present technology, a neural network layer, a part of a neural network layer, or a plurality of fused neural network layers can be mapped to a single cluster of compute cores as a mapping unit. A cluster of compute cores are a group of cores of a given processing region that are configured to work together to compute a mapping unit. For example, the nodes of a first layer 910 of a neural network and the nodes of a second layer 920 can be mapped as mapping units to the compute cores, while the node of a third layer 930 can be mapped as a mapping unit to compute cores, as illustrated in FIG. 9. Furthermore, a mapping unit 1010 can be computed by a compute core cluster 1020 as illustrated in FIG. 10. Optionally, more compute core than what are needed to compute a mapping unit can be configured in a compute cluster to improve computing performance.

Figure 11:
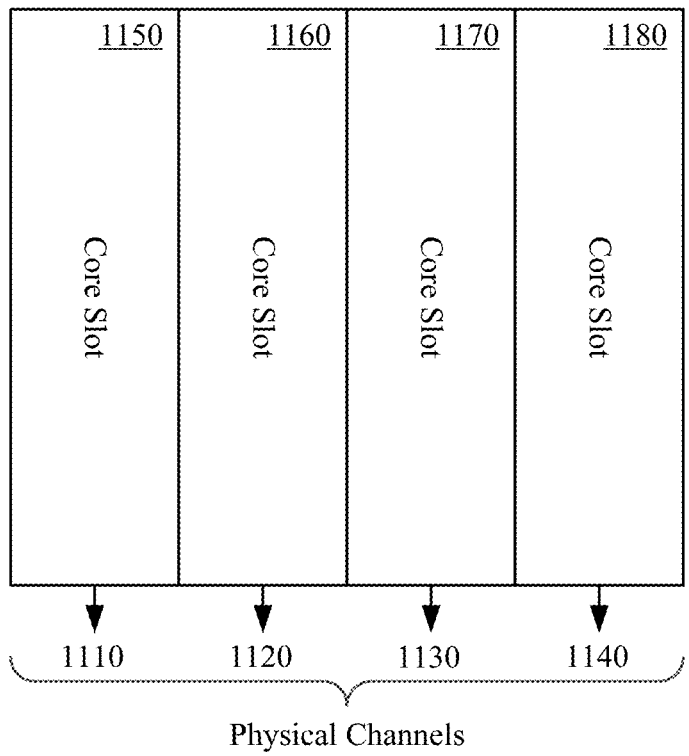
FIG. 11 illustrates exemplary memory core slots, in accordance with aspects of the present technology.
Figure 12:
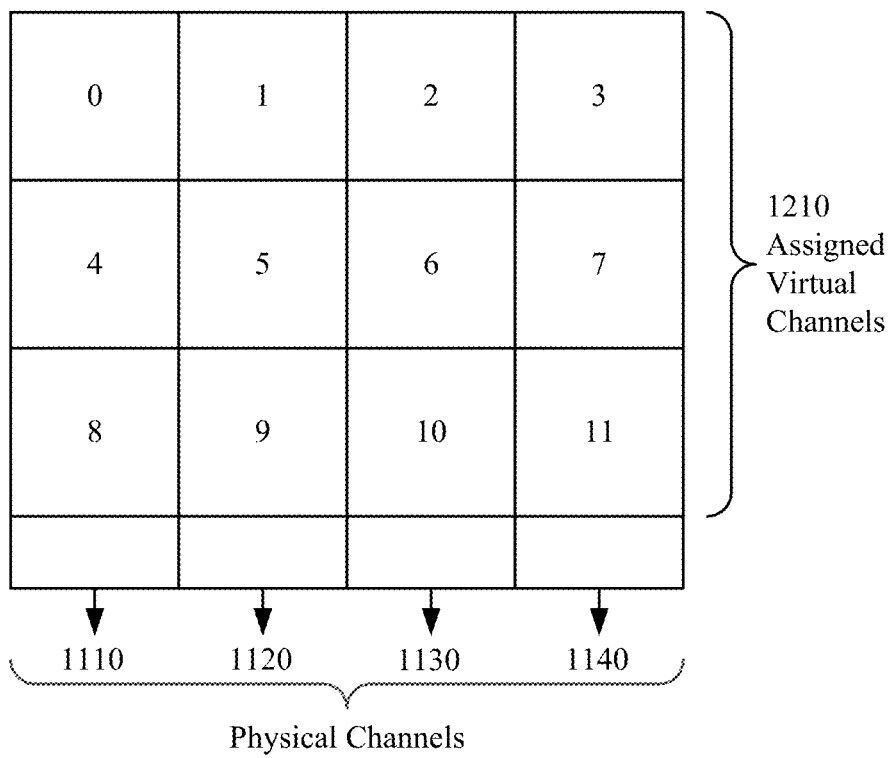
FIG. 12 illustrates exemplary virtual channels of a memory, in accordance with aspects of the present technology.

As illustrated in FIG. 11, the compute cores 120-128 can compute a plurality of physical channels 1110-1140 simultaneously. In addition, the physical channels 1110-1140 of the compute cores can be associated with respective shares of the second memory region 118, which are referred to herein as core slots 1150-1180. The compute cores 120-128 can also be configured to compute a plurality of virtual channels 1210, as illustrated in FIG. 12. The virtual channels 1210 also be associate with respective shares of the second memory region 118. In one implementation, the number of virtual channels 1210 of a compute core 120-128 can be greater than the number of physical channel 1110-1140.

Again, second memory 118 can be logically or physically organized into a plurality of regions. In one implementation, the second memory region 118 can be organized into a plurality of processing region macros, wherein each processing region 112-116 can be associated with one or more processing region macros of the second memory region 118. In addition, processing region macros can be organized into core slots, wherein each physical channel of a compute core is associated with a core slot. The share of the second memory region can be flexibly assigned during a programming phase, rather than being a static fixed amount. In addition, the compute cores 120-128 in respective processing regions 112-116 can be configured in one or more clusters. The clustering of compute cores can be utilized to increase computing by using multiple compute cores. Each compute core can be configured to compute a whole or a part of a compute operation. The compute workload can be distributed over the compute cores of a given cluster based on the output channels of the compute cores, the data in the first memory 102-110, or a combination thereof. For the output channels, the workload can be distributed for whole or partial channels. Each distribution has its own properties. For instance, one configuration can be used to reduce access to the second memory 118, while the other can facilitate the mapping of a layer of a neural network model over multiple macros of the second memory 118. A group of compute cores can be configured for a given cluster shape and type.

Figure 14:
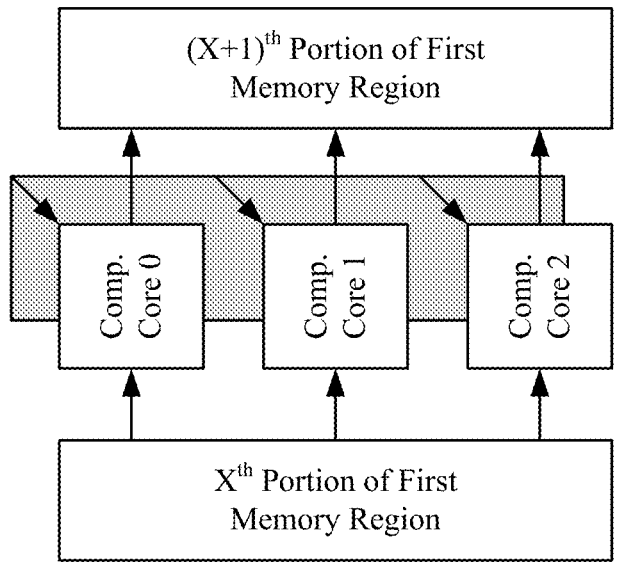
FIGS. 13-16 illustrate a whole channel compute core configuration, in accordance with aspects of the present technology.
Figure 13:
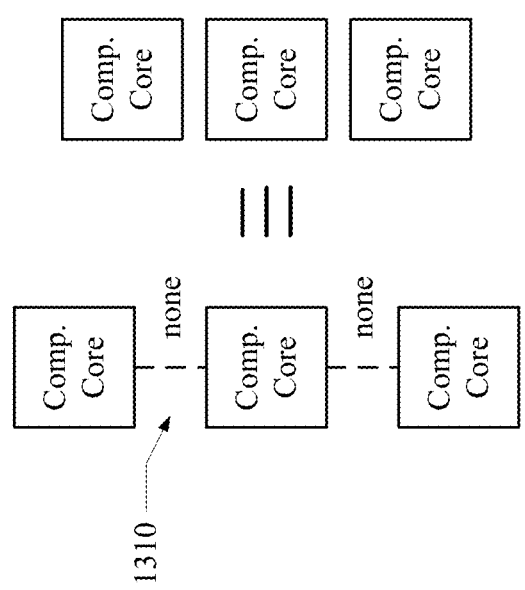
Figure 15:
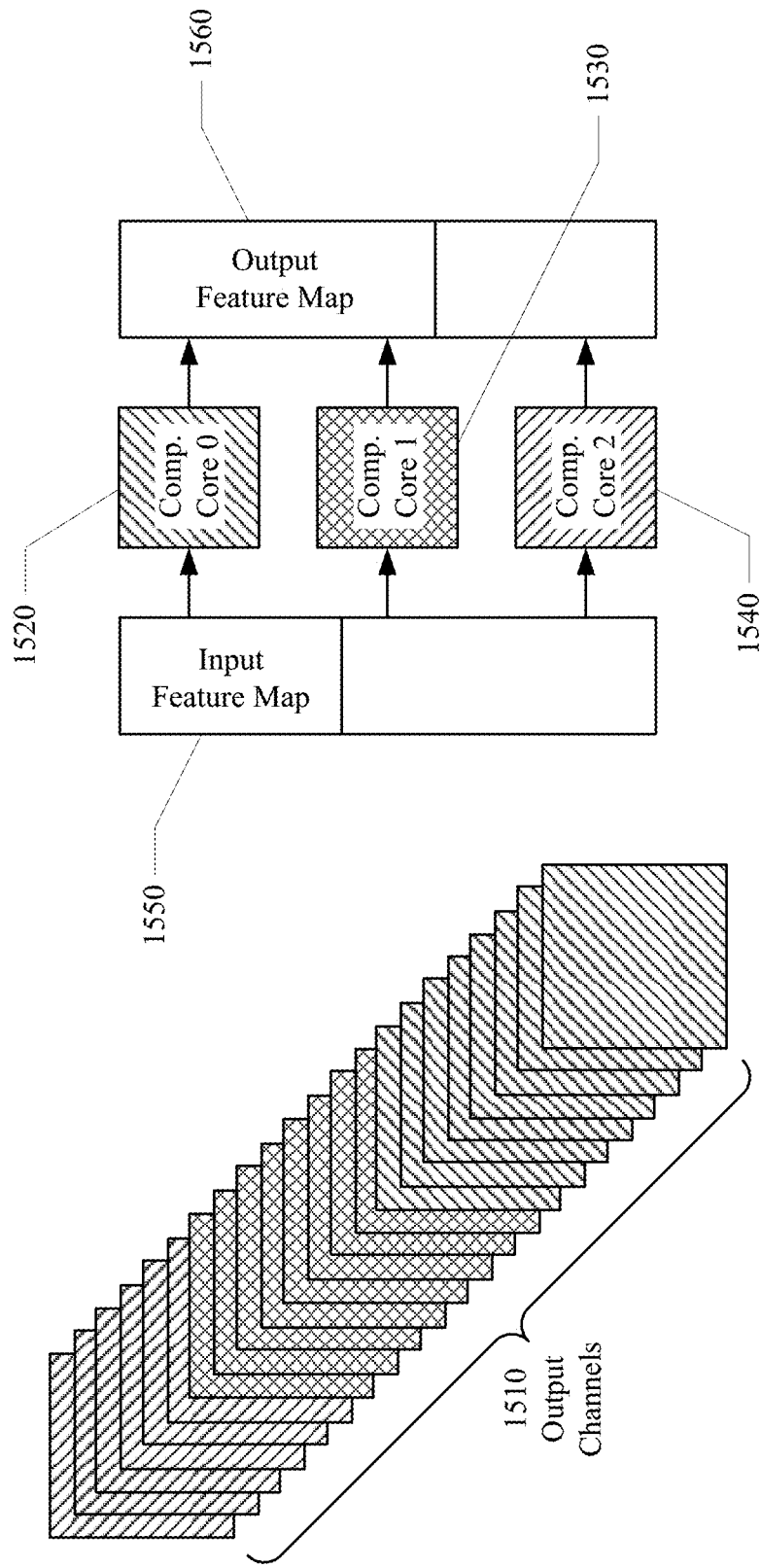
Figure 16:
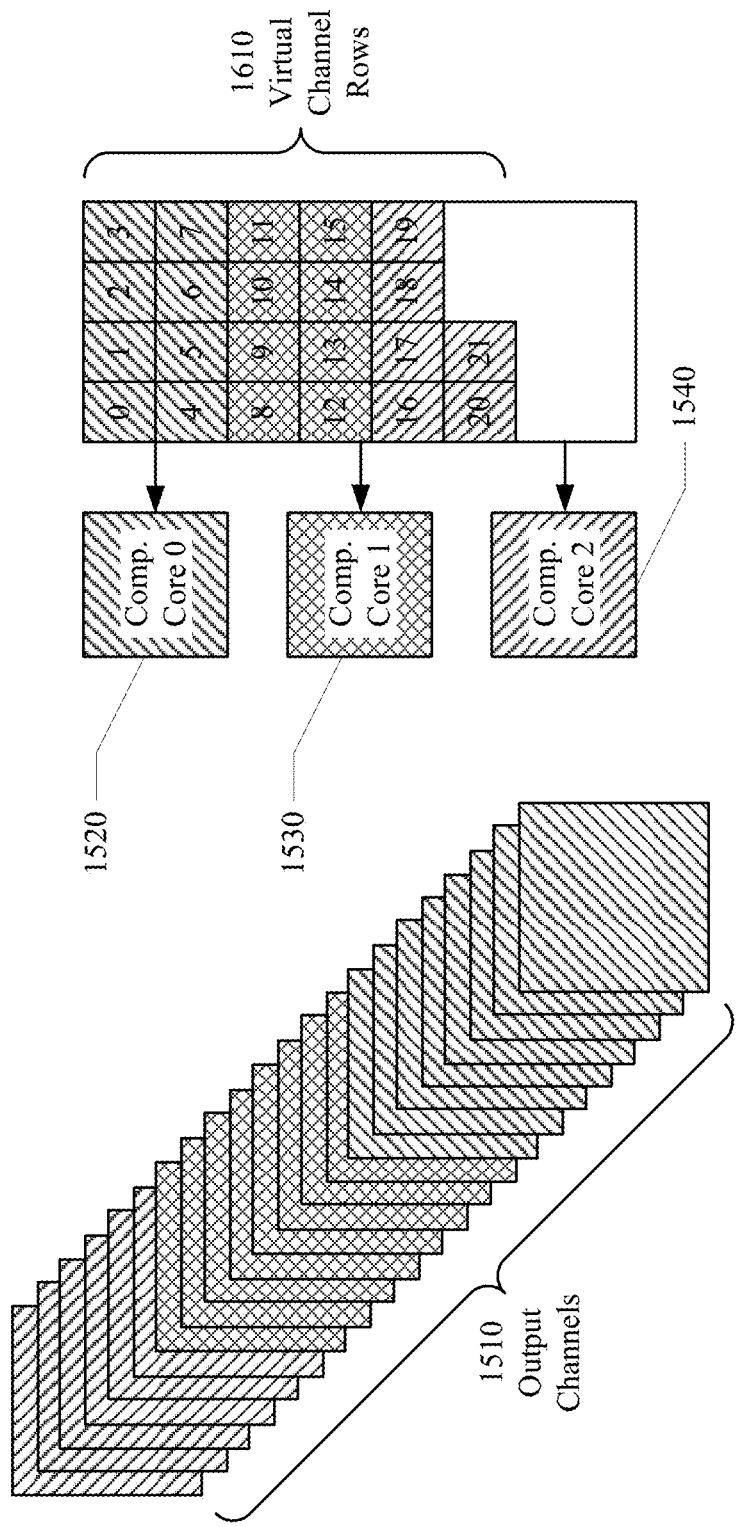

Referring now to FIG. 13, a whole channel compute core configuration, in accordance with aspects of the present technology, is shown. The compute cores, of a given processing region, can be configured in whole channel mode, wherein one or more compute cores perform computations independently of the other compute cores in a respective processing region. In the whole channel mode, the compute cores do not pass data 1310 sequentially from a given compute core to an adjacent compute core. Referring now to FIG. 14, in the whole channel mode, each compute core in the cluster computes a designated number of channels. Each of the cores is responsible for reading data and writing the output result on their own. For example, a whole channel mode configured compute core reads data from the $X^{th}$ portion of the first memory region, and optionally the second memory region, performs a corresponding calculation and stores the result in the $(X+1)^{th}$ portion of the first memory region. The compute cores in whole channel mode do not share data with other compute cores and work as standalone compute cores. Referring now to FIG. 15, an exemplary whole channel compute core configuration is illustrated. In the illustrated example, the mapping unit has 22 output channels 1510 and is mapped to a three-compute core cluster 1520-1540. Each compute core has four output physical channels. An input feature map 1550 is stored in an adjacent first portion of the first memory region, and an output feature map 1560 is stored in an adjacent second portion of the first memory region. As further illustrated in FIG. 16, each compute core 1520-1540 is configured to access weights for the respective output channels. Each compute core is configured to compute a product of the input feature map and the weights of respective sets of the 22 output channels 1610 of the output feature map. Each compute core is responsible for almost one-third of the computation workload. The second memory region can be organized based on output channels, and result in the 22 output channels 1610 mapped into five and a half virtual channel rows. Although, the compute core cluster is illustrated as mapped over a single macro of the second memory region, the compute core cluster can also be mapped over a plurality of macros of the second memory region.

Figure 18:
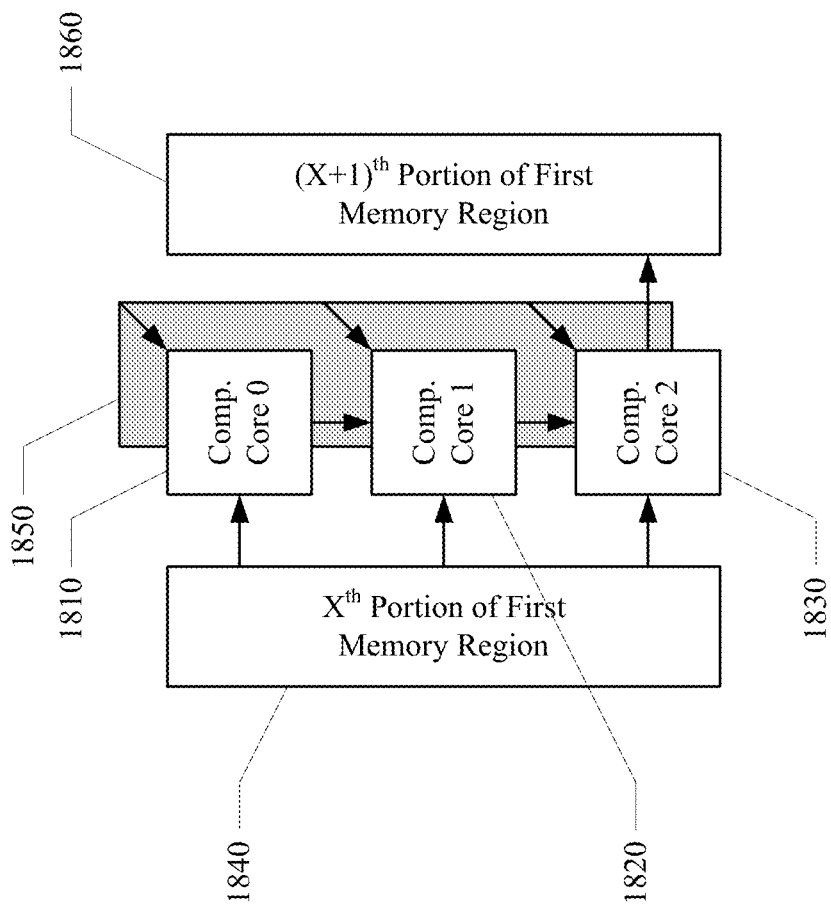
FIGS. 17-20 illustrate a partial sum computer core configuration, in accordance with aspects of the present technology.
Figure 17:
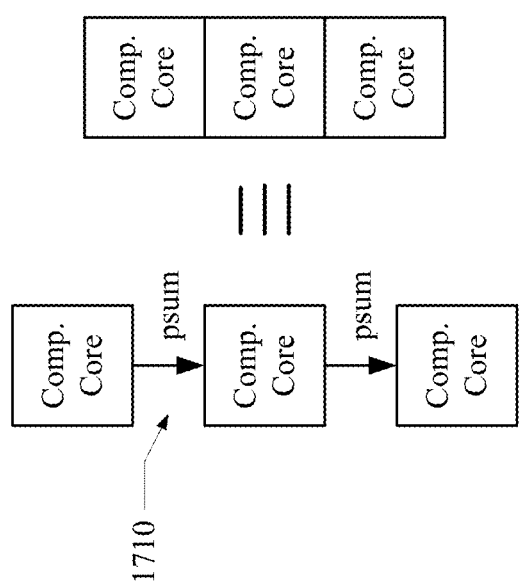
Figure 19:
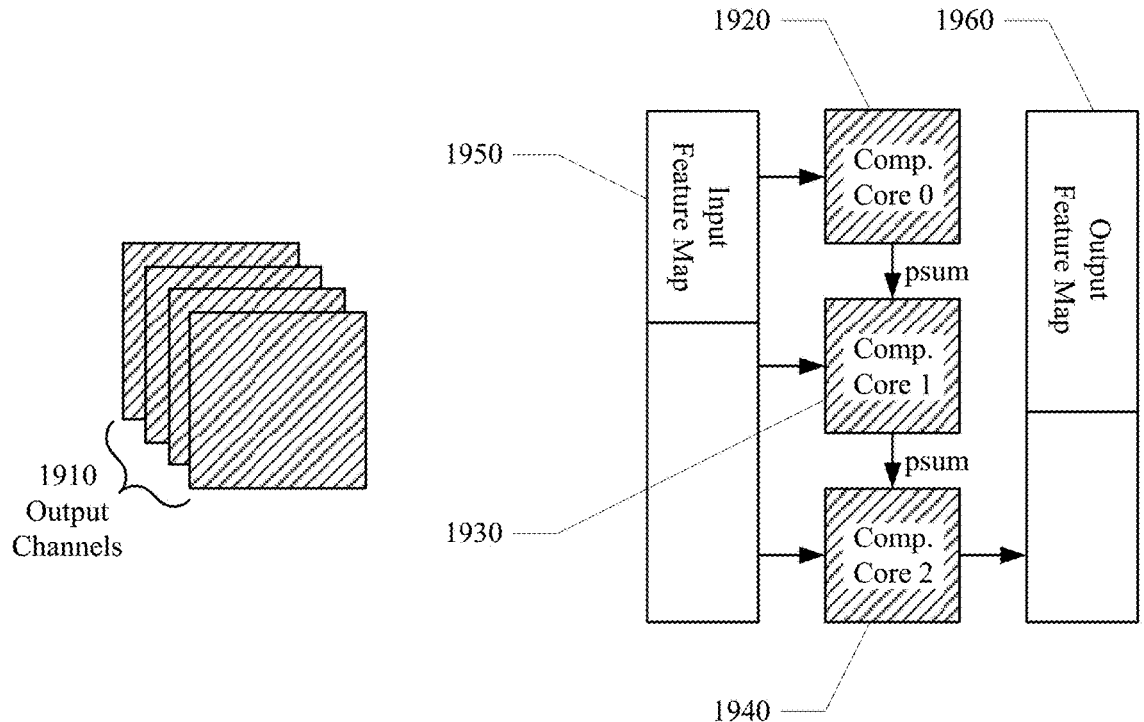
Figure 20:
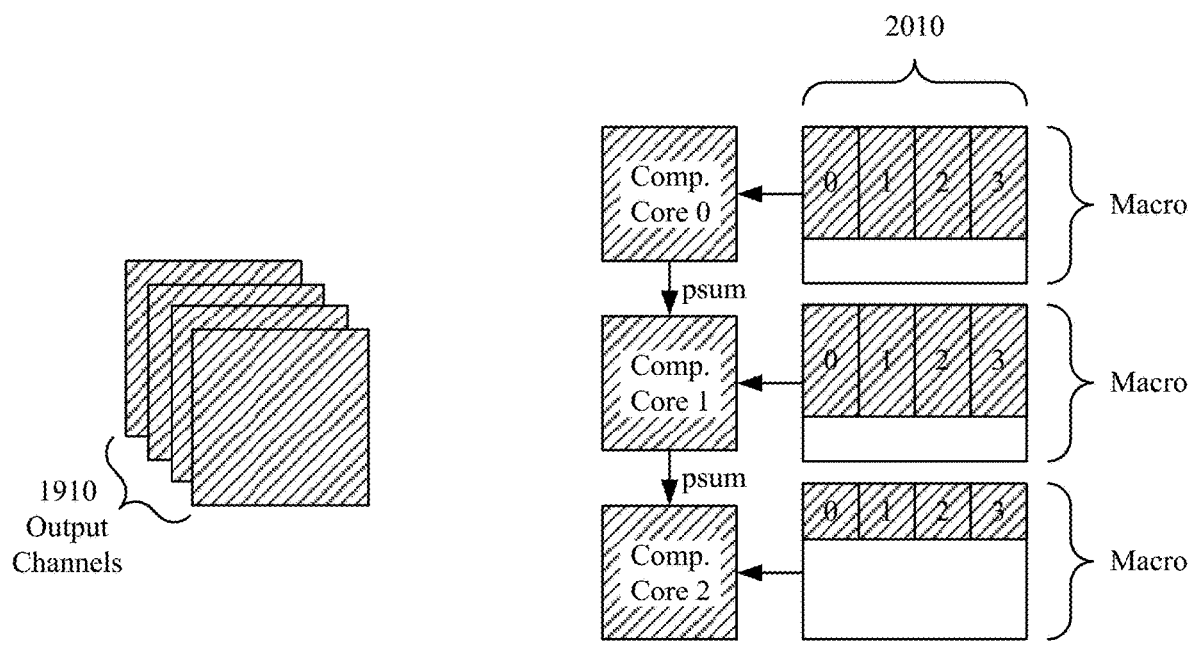

Referring now to FIG. 17, a partial sum computer core configuration, in accordance with aspects of the present technology, is shown. In the partial sum passing mode, one or more compute cores can be configured to perform computations and pass their respective results as a partial sum 1710 to an adjacent compute core within a same processing region for performing a further computation utilizing the partial sum. In the partial sum configuration, the size of data of a single channel cannot fit in a single core slot of the second memory region. In such case, the data can be distributed over multiple macros of the second memory region. In the partial sum configuration, each compute core computes a part of the output and passes it to a neighboring core in the cluster. Hence, the partial-sum mode is equivalent to a compute core with a long second memory region macro. The compute cores 1810-1830 in a partial sum cluster all have access to data in the corresponding portion of the first memory region 1840 and data in the second memory region 1850, and the last core 1830 in the chain will writeback results to the other adjacent portion of the first memory region 1860, as illustrated in FIG. 18. Referring now to FIGS. 19 and 20, an exemplary partial sum compute core configuration is illustrated. In the illustrated example, the partial sum cluster mapping includes four output channels 1910, the mapping is a three-compute core cluster 1920-1940, and each core has four physical channels. As illustrated in FIG. 19, each compute core is configured to access feature map values in a first portion of the first memory region 1950. In addition, each compute core is configured to access weights in the physical channels of the second memory region 2010, as illustrated in FIG. 20. Because the number of output channels is the same as the number of physical channels of the compute cores, all the cores can compute all the output channels. The first compute core 1920 can compute a first partial sum from corresponding portions of the input feature map in the first memory 1950 and corresponding portions of the weights for the four physical channels in the second memory region 2010. The first compute core 1920 can pass the first partial sum to the second compute core 1930. The second compute core 1930 can compute a second partial sum using the first partial sum, corresponding portions of the input feature map in the first memory 1950 and corresponding portions of the weights for the four physical channels in the second memory 2010. The second compute core 1930 can pass the second partial sum to the third compute core 1940. The third compute core can pass the result to an adjacent second portion of the first memory region for storage as output feature map data 1960.

Figure 21:
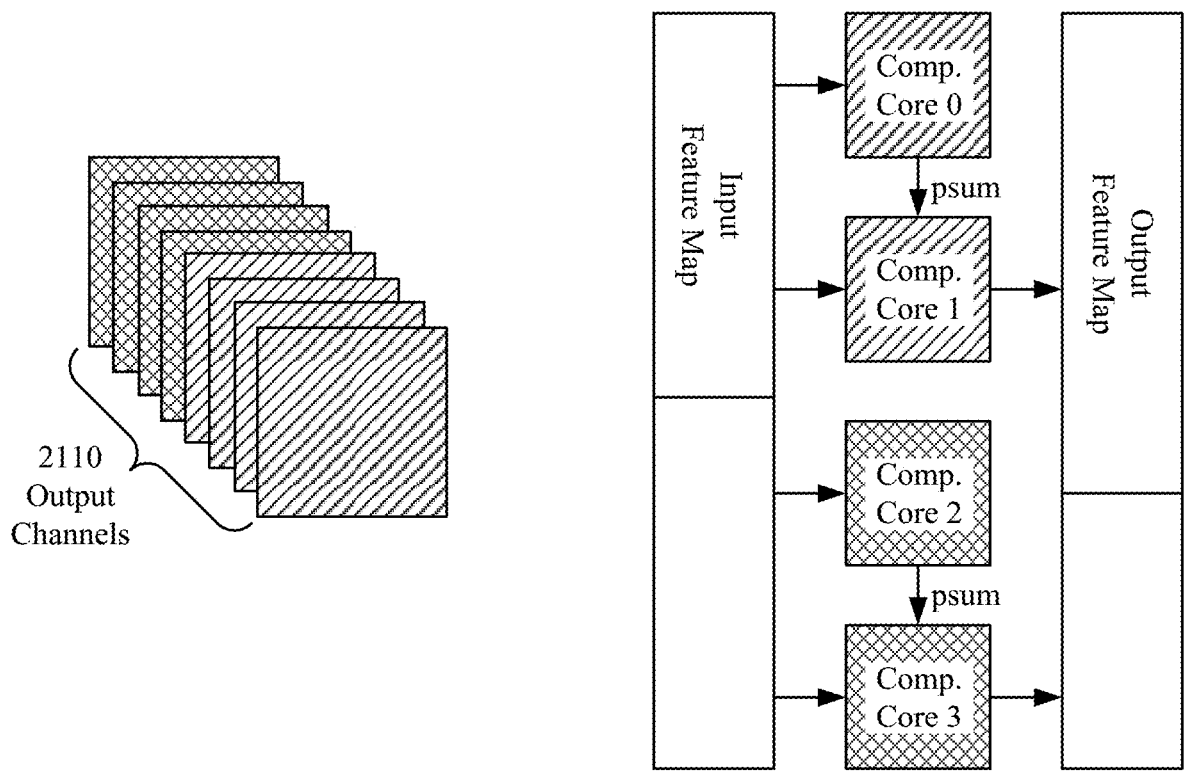
FIGS. 21 and 22 illustrate a partial sum computer core configuration, in accordance with aspects of the present technology.
Figure 22:
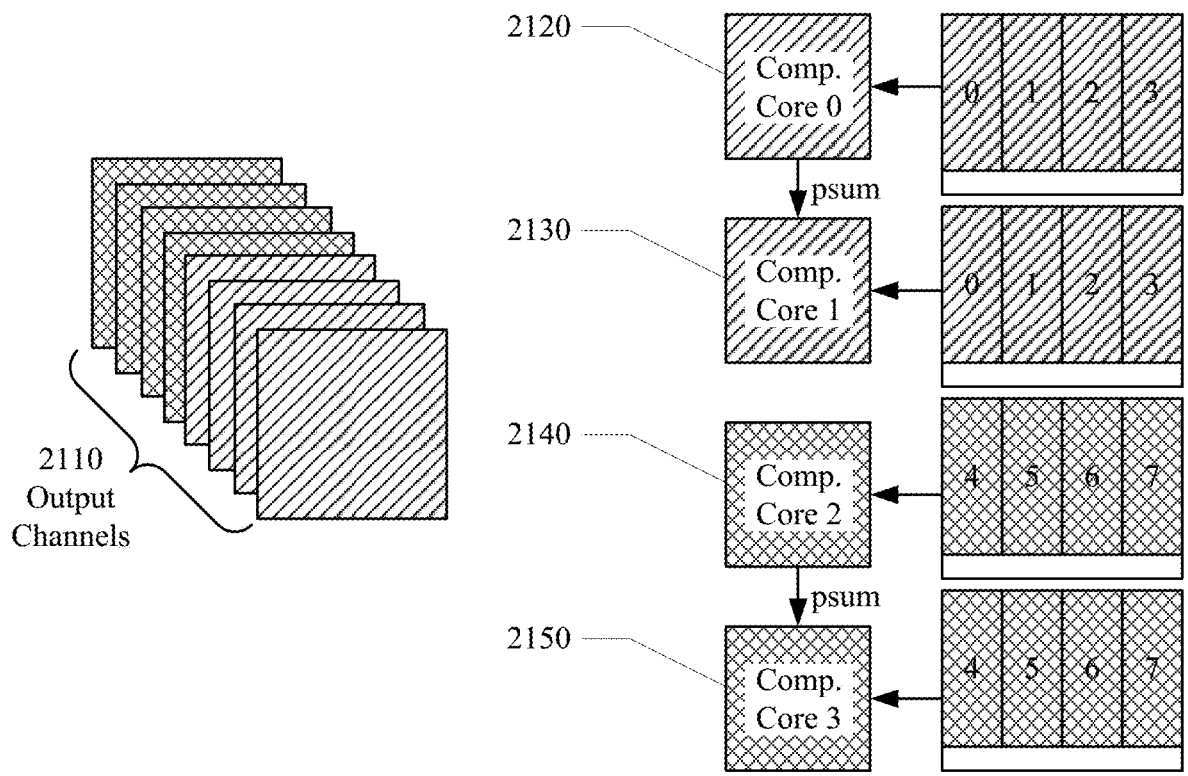

In another example, the partial sum cluster mapping can include eight output channels 2110, four compute cores 2120-2150, and each core has four physical channels, as illustrated in FIGS. 21 and 22. Accordingly, there are more output channels than there are physical channels of the compute cores in the cluster. Because the compute cores cannot compute more output channels than they have physical channels in the case of computing partial sums, the four compute cores of the cluster can be configured into two subsets to compute the eight output channels. Each subset of compute cores will pass partial sum data therein. Each compute core computes four corresponding output channels.

In other cases, the compute cores can compute more output channels than the physical channels. For example, if the compute core has eight physical channels and 32 output channels have been assigned, the compute core can compute eight channels at a time in a sequential manner. However, if more compute cores are available, the output channels can be distributed across the additional compute cores to speed up the process. In such case the same 32 output channel can be computed across two compute cores for example, wherein each compute core is assigned 16 output channels to compute.

Figure 23:
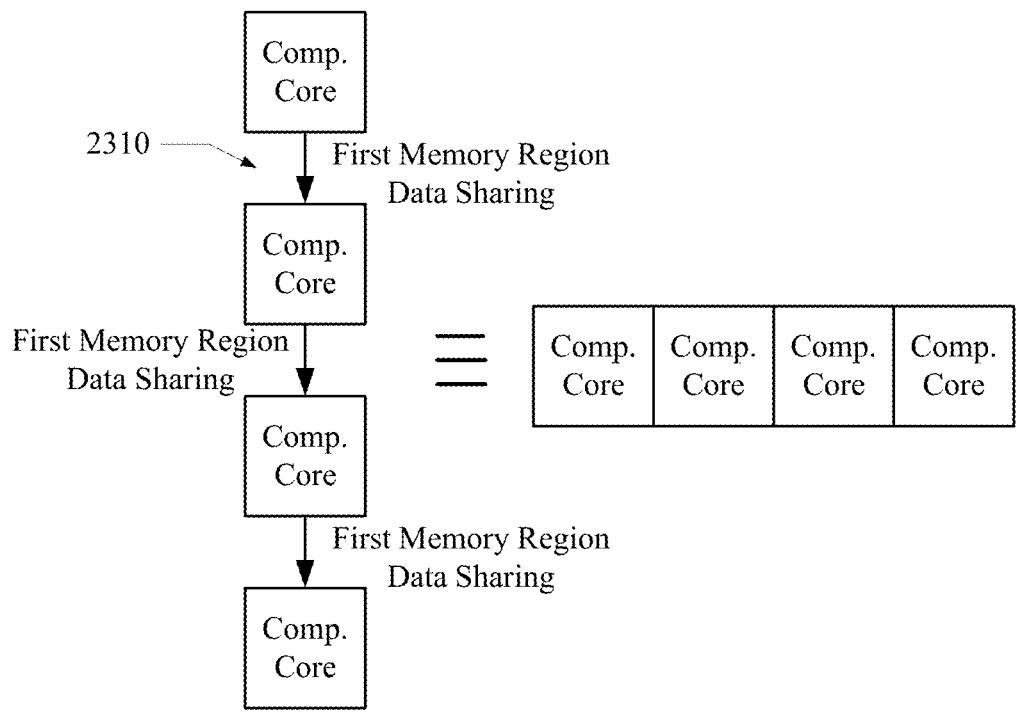
FIGS. 23-26 show a first memory region polymorphic computer core configuration, in accordance with aspects of the present technology.
Figure 24:
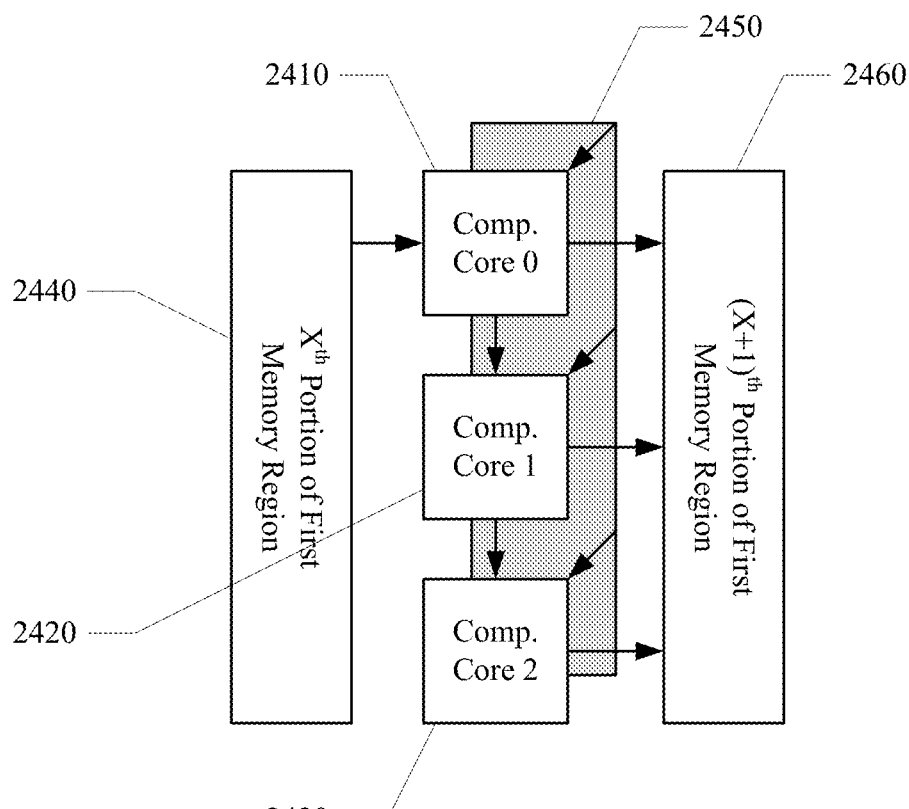
Figure 25:
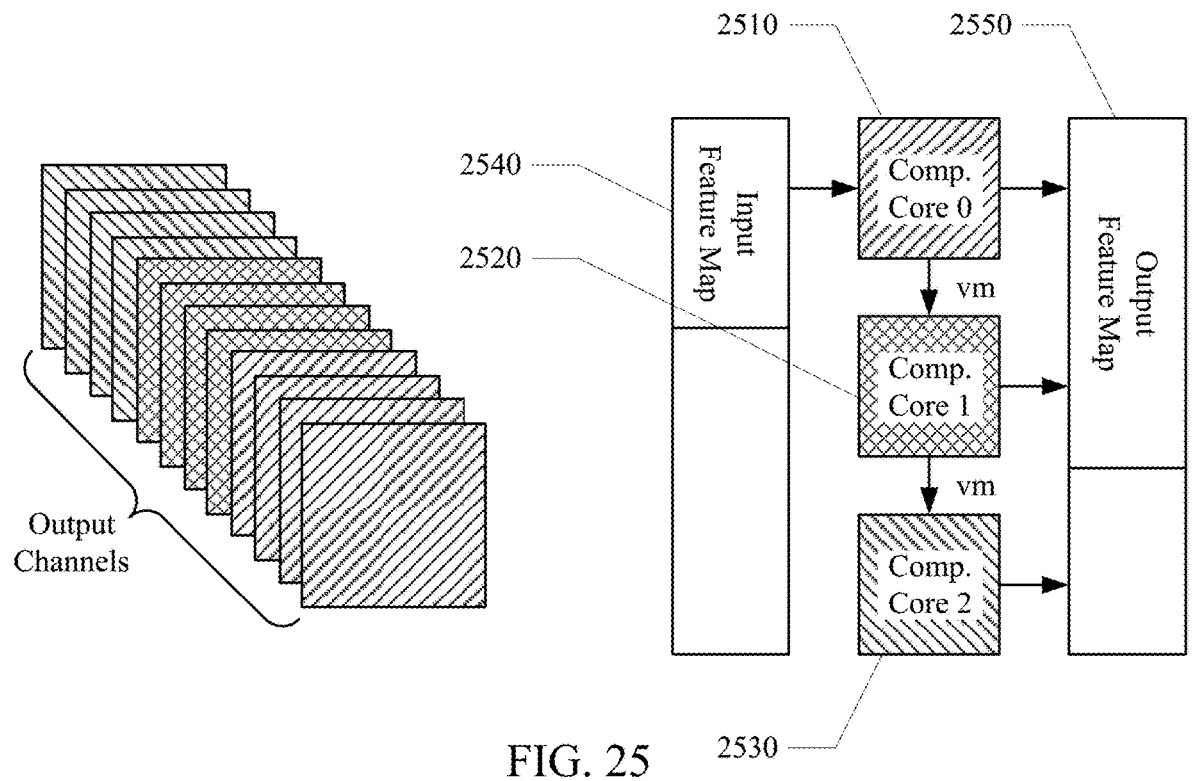
Figure 26:
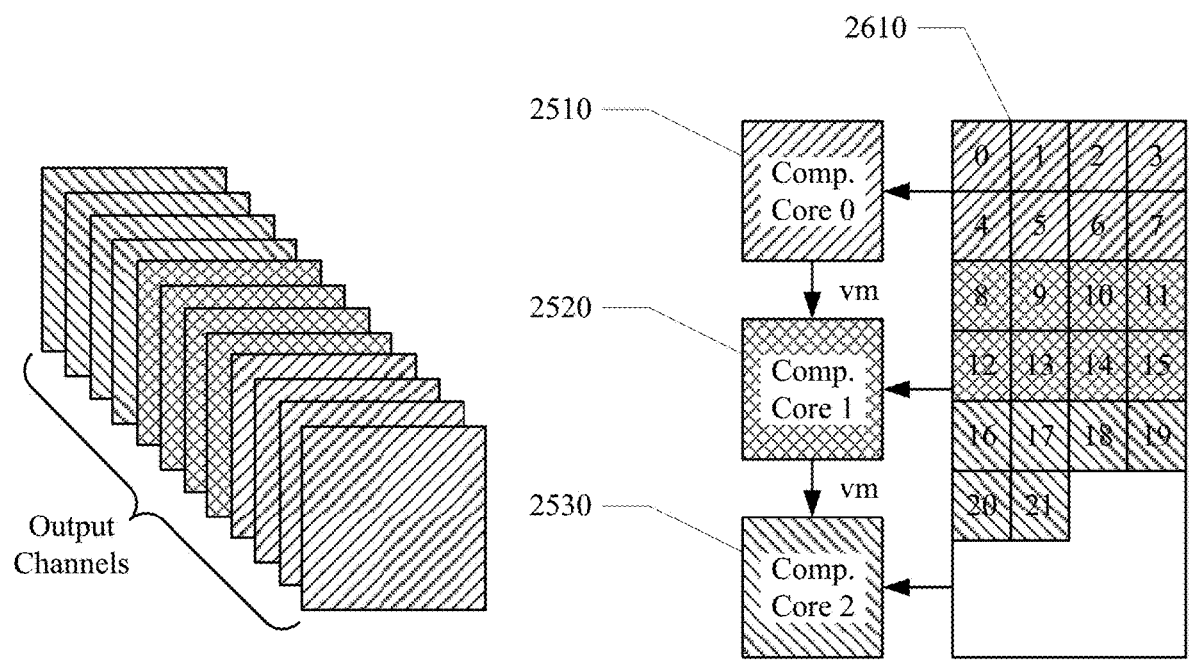

Referring now to FIG. 23, a polymorphic first memory compute core configuration, in accordance with aspects of the present technology, is shown. The compute cores, of a given processing region, can be configured in a polymorphic configuration, wherein one or more cores share data from a given portion of the first memory region 2310 with adjacent compute cores. The polymorphic first memory compute core configured cluster is equivalent to a wider core with more physical channels. Such a configuration can be used to improve reuse of data in the first memory region and reduce the total number of accesses to the corresponding portion of the first memory region. It should also be noted that reuse of data in the first memory region is also an inherent property of the compute core configuration of the plurality of processing region in accordance with aspects of the present technology because the compute cores can share data among the physical channels. The first compute core 2410 in a polymorphic first memory compute cluster has access to data in the corresponding portion of the first memory region 2440 and can share the data with the other compute cores 2420, 2430 in the cluster. All the compute cores 2410-2430 in the polymorphic first memory configuration have access to data in the second memory region 2450, and all of the compute cores 2410-2430 can write results to the other adjacent portion of the first memory region 2460, as illustrated in FIG. 24. Referring now to FIGS. 25 and 26, an exemplary polymorphic first memory region compute core configuration is illustrated. In the illustrated example, the first compute core 2510 of a cluster can access input feature map data in a first adjacent portion of the first memory region 2540. The first computer core 2510 can share in the data of the input feature map with the other computer cores 2520, 2530 of the cluster, as illustrated in FIG. 25. Each compute core 2510-2530 in the cluster can also access data in the second memory region 2610, as illustrated in FIG. 26. Each compute core 2510-2530 in the cluster can then perform a respective computation and write the results as output feature map data to the other adjacent portion of the first memory region 2550, as illustrated in FIG. 25. The polymorphic first memory compute cluster can be configured by a mapping algorithm that starts by creating a whole-channel cluster, then converting to the first memory region polymorphic computer cluster. In the illustrated three compute core cluster, each core can be responsible for up to one third of the computer workload. The second memory region 2610 can be configured to have four output channels, that can be mapped into five and a half virtual channel rows in the second memory region 2610, as illustrated in FIG. 26.

Figure 27:
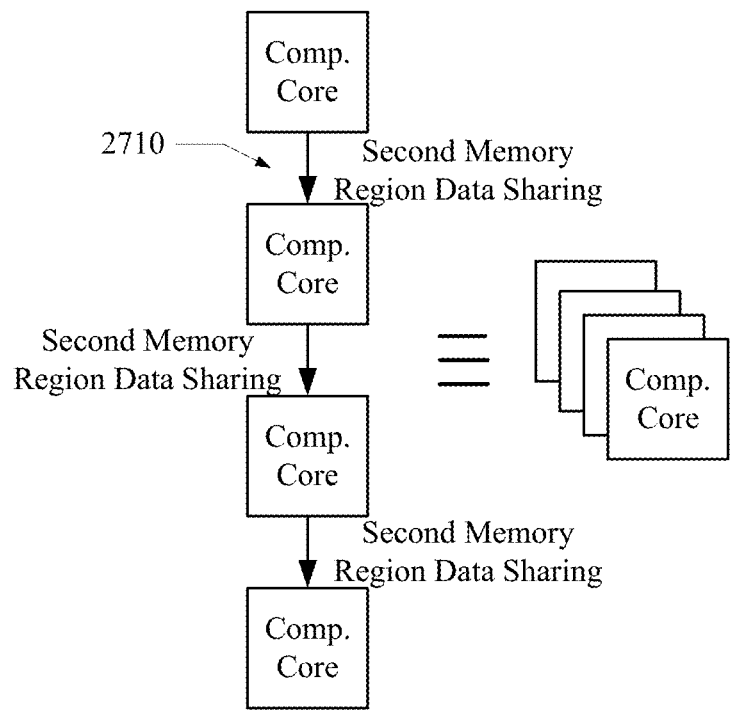
FIGS. 27-30 show a second memory region polymorphic compute core configuration, in accordance with aspects of the present technology.
Figure 28:
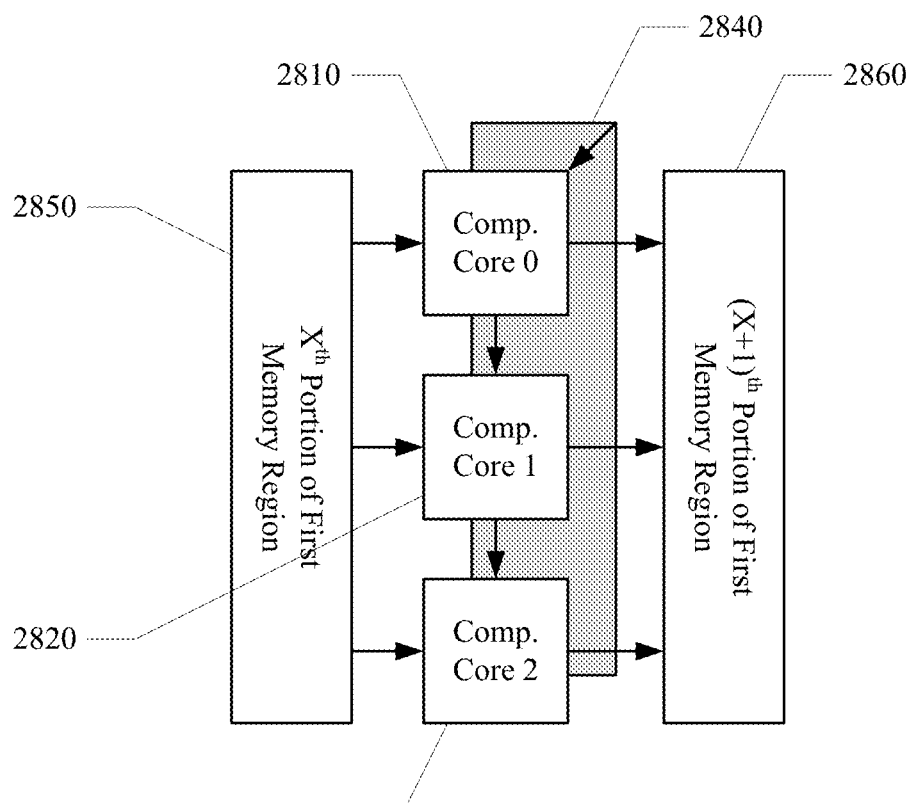
Figure 29:
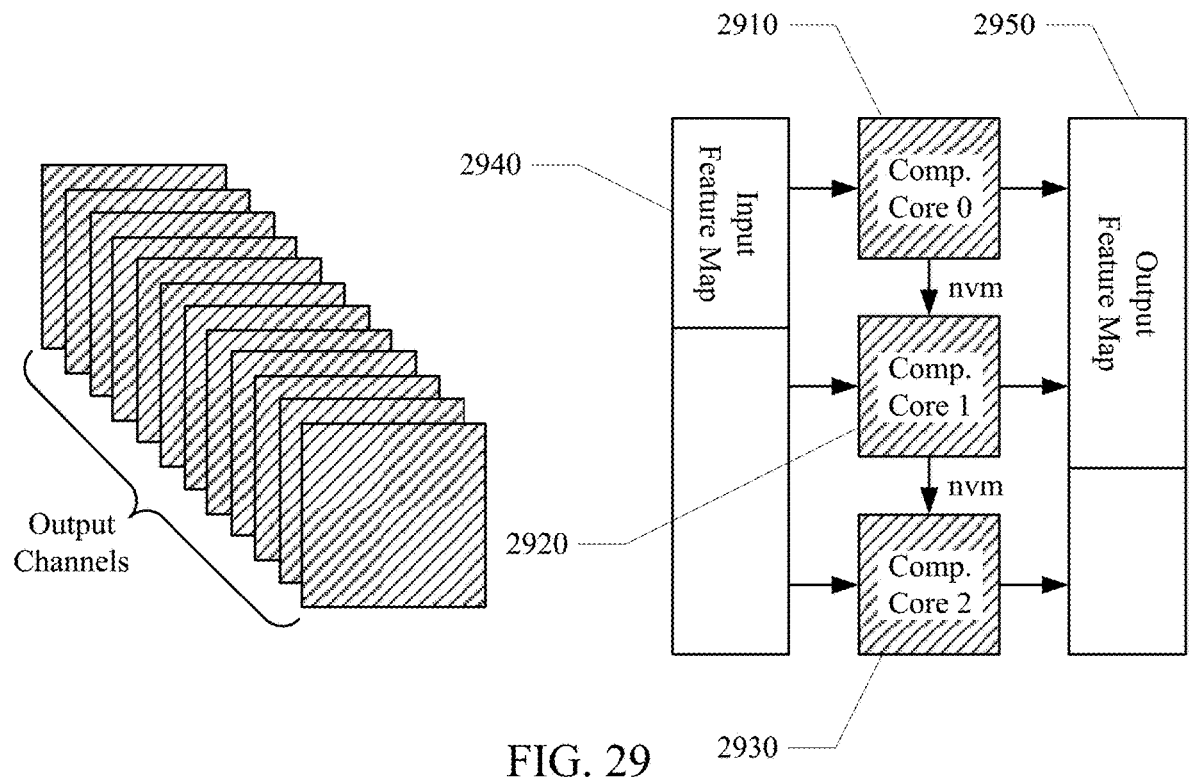
Figure 30:
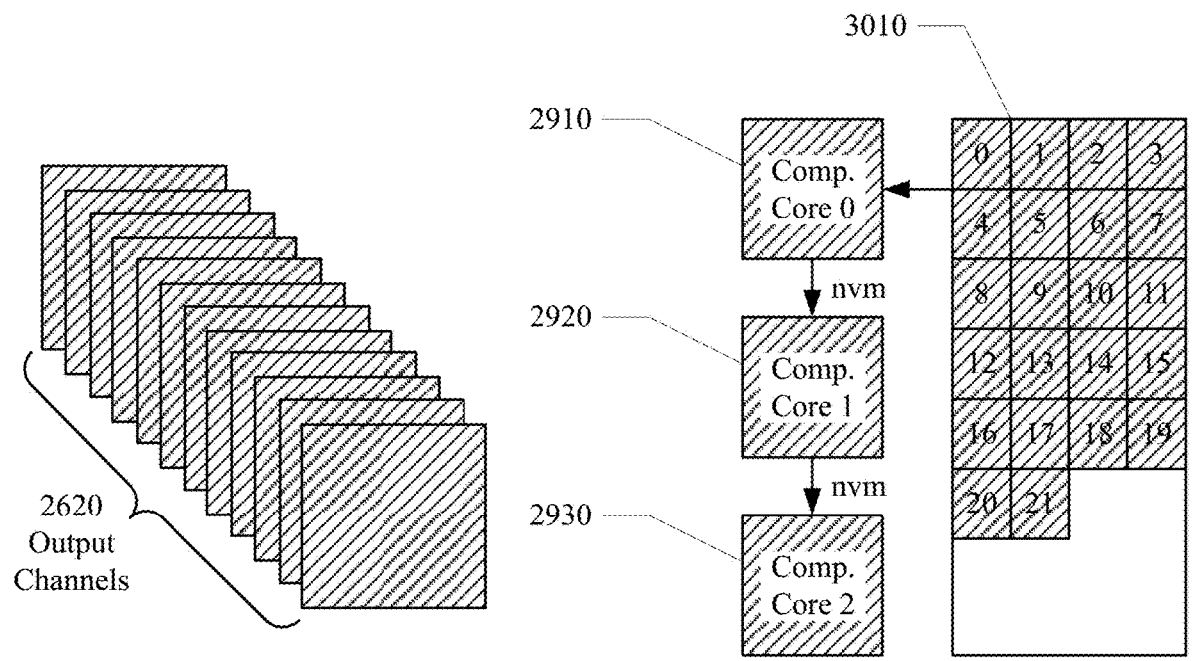

Referring now to FIG. 27, a polymorphic second memory compute core configuration, in accordance with aspects of the present technology, is shown. The compute cores, of a given processing region, can be configured in a polymorphic configuration, wherein one or more compute cores share data from a given portion of the second memory region 2710 with adjacent compute cores. In the polymorphic second memory compute core configuration, each compute core of the cluster can compute all the output channels, but work on different pixels of an output feature map. Accordingly, the other compute cores in the cluster operate as workers for the first compute core. The number of compute cores that can be assigned is the number of mapping unit output feature map pixels. The compute cores of the cluster access a different sequence of data in the second memory region since they are working on different pixels. Such a configuration can be used to reduce the number of access to the second memory region by sharing the data among cores in the cluster. The first compute core 2810 in a polymorphic second memory cluster has access to data in the corresponding portion of the second memory region 2840 and can share the data with the other compute cores 2820, 2830 in the cluster. All the compute cores 2810-2830 in the polymorphic second memory cluster have access to data in the first memory region 2850, and all of the compute cores 2810-2830 can write results to the other adjacent portion of the first memory region 2860, as illustrated in FIG. 28. Referring now to FIGS. 29 and 30, an exemplary polymorphic second memory compute core configuration is illustrated. In the illustrated example, the compute cores 2910-2930 of a cluster can all access input feature map data in a first adjacent portion of the first memory region 2940, as illustrated in FIG. 29. The first compute core 2910 can access data in the second memory region 3010, and share the data with the other compute cores of the cluster 2920, 2930, as illustrated in FIG. 30. In one implementation, the cluster can include 3 compute cores 2910-2930 mapped with a total of 22 physical channels. Each compute core can have four physical channels. The top compute core 2910 of the chain is assigned the whole portion of the second memory region 3010 needed by the mapping, and access the whole 22 output channels of data. Each compute core computes all 22 output channels, but for different pixels. The other two compute cores 2920, 2930 of the cluster will access the first compute core 2910 rather than the second memory region 3010 to get weight data. The neighbor access can be done in a dataflow manner without special synchronization. Each computer core 2910-2930 in the cluster can then perform a respective computation and write the results as output feature map data to the other adjacent portion of the first memory region 2950, as illustrated in FIG. 29.

Figure 31:
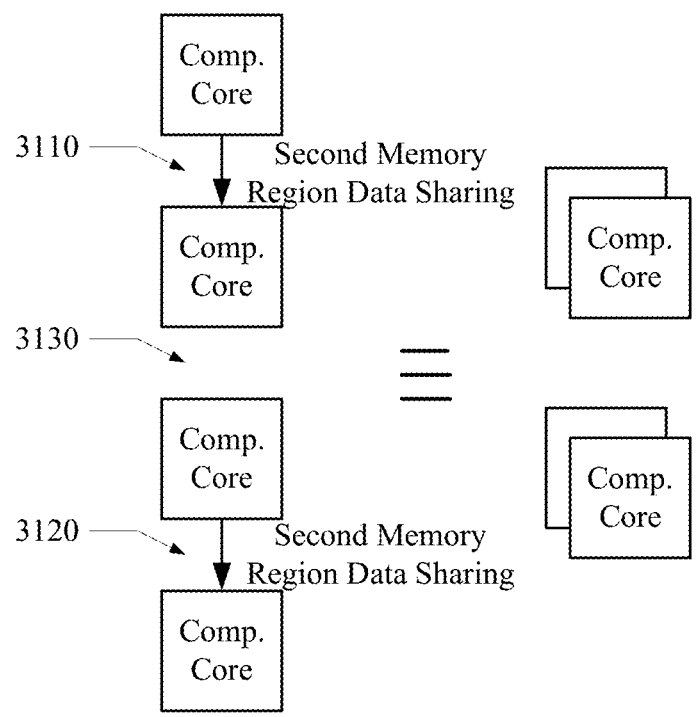
FIGS. 31-34 show a compound computer core configuration, in accordance with aspects of the present technology.
Figure 32:
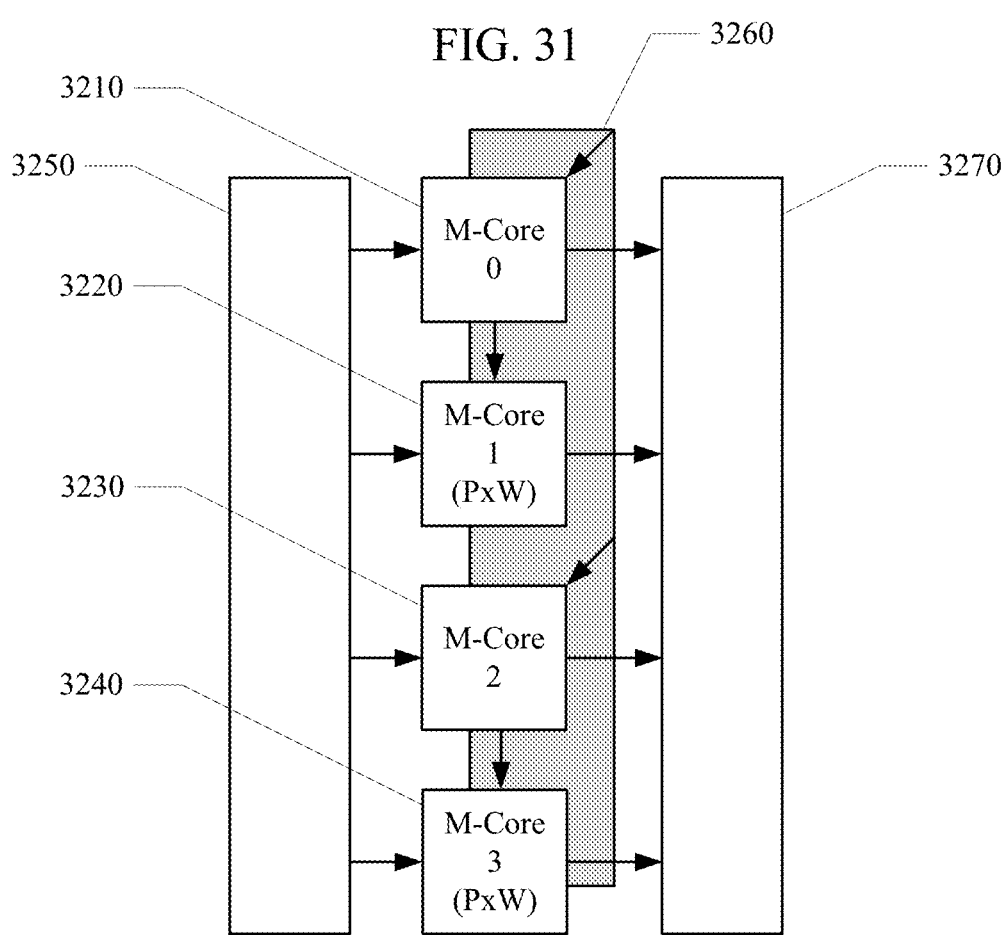
Figure 33:
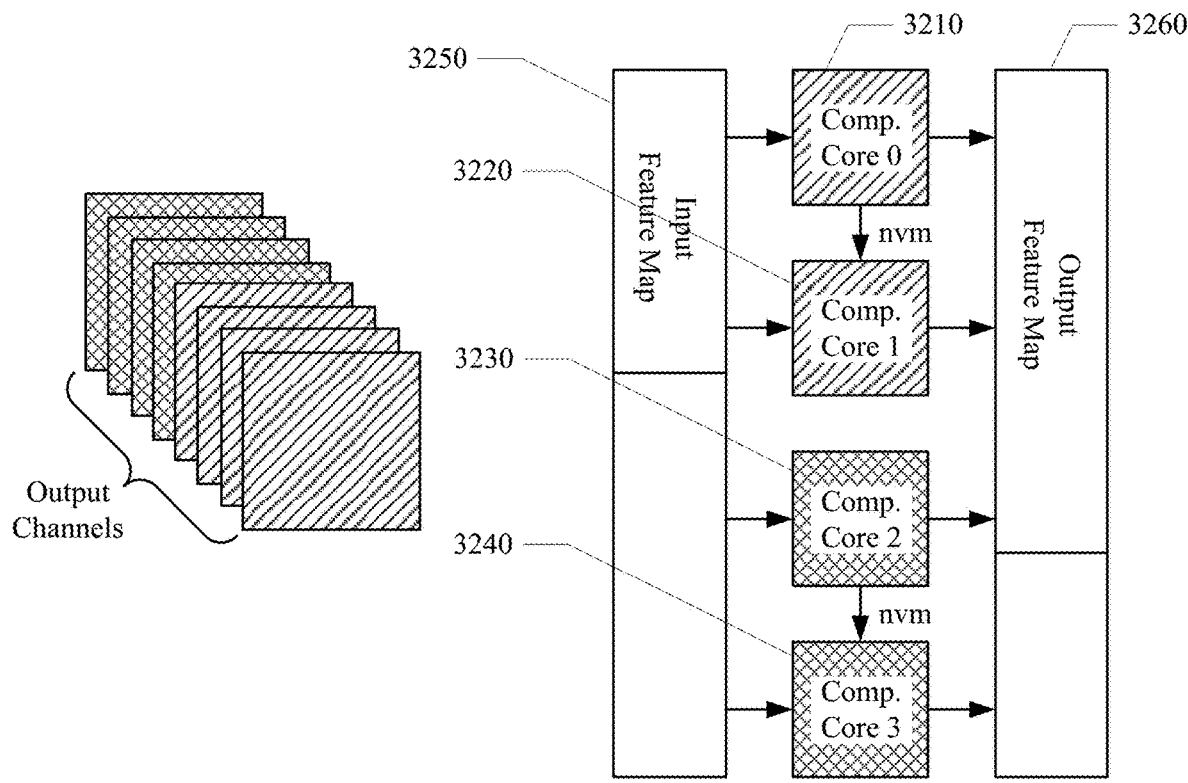
Figure 34:
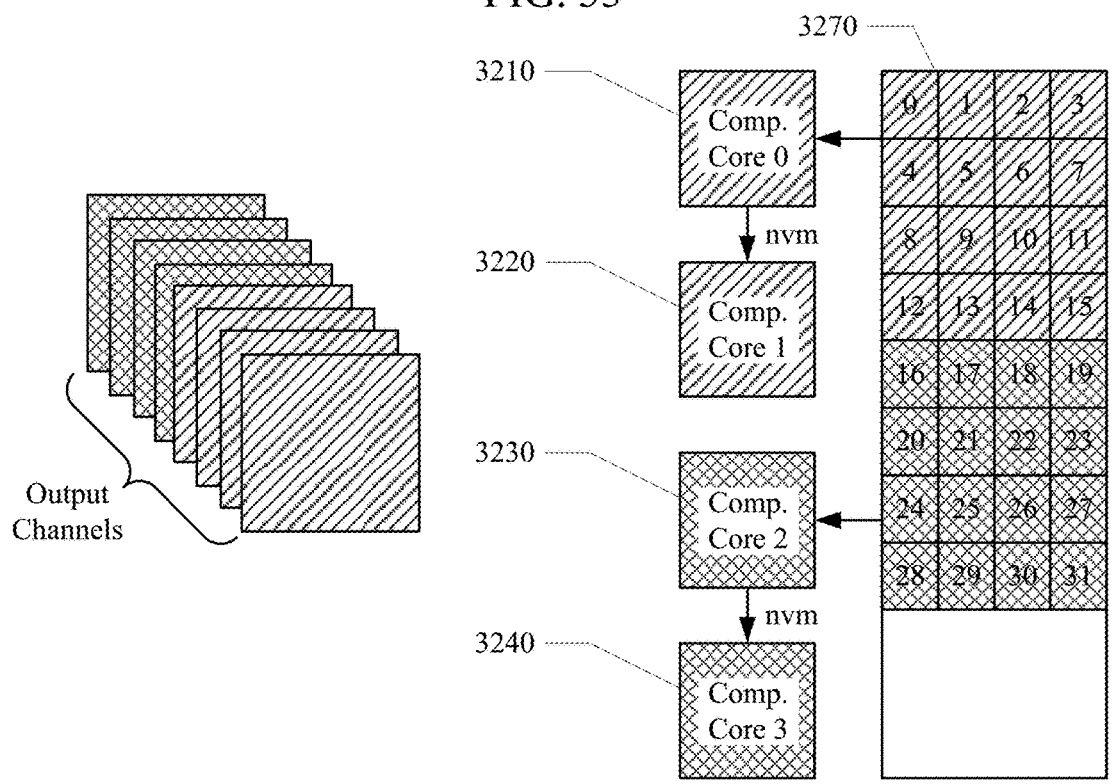

Referring now to FIG. 31, a compound computer core configuration, in accordance with aspects of the present technology, is shown. Each compute core in a cluster, of a given processing region, can access an adjacent portion of the first memory region. The compute cores can also be configured to share data from a given portion of the second memory region 3110, 3120 with adjacent compute cores within the same set. However, compute cores in different sets do not share 3170 data with other compute cores in other sets. The compute cores in each set compute a designated number of output channels and store results into the other adjacent portion of the first memory region. Referring now to FIG. 32, an exemplary compound compute core configuration is illustrated. In the illustrated example, the mapping unit has 22 output channels and is mapped to a four-compute core cluster 3210-3240 including two sets of two compute cores each. For example, a first set can include first and second compute cores 3210, 3220, and a second set can include third and fourth compute cores 3230, 3240. Each set of compute cores can have four physical channels per core. Each compute core 3210-3240 in each set can access input feature map data in the first memory 3250 as illustrated in FIG. 31. The first compute cores 3210, 3230 in a respective set can access weight data in a respective set of output channels in the second memory 3270, as illustrated in FIG. 34. The first compute core in a first set 3210 can be configured to share data from the second memory 3270 with the other compute cores in the first set 3220. Similarly, a first compute core in a second set 3230 can be configured to share data from the second memory 3270 with the other compute cores in the second set 3240. Each compute core 3210-3240 of each set can store result back as output feature map data to the other adjacent portion of the first memory 3260. Accordingly, each set of two compute cores act as standalone pixel computing groups. However, the whole result is computed using the two sets of pixel computing groups. At a top level, each of the pixel computing groups can be treated as a standalone compute core set, and the workload can be distributed between them in a whole-channel way.

Figure 35:
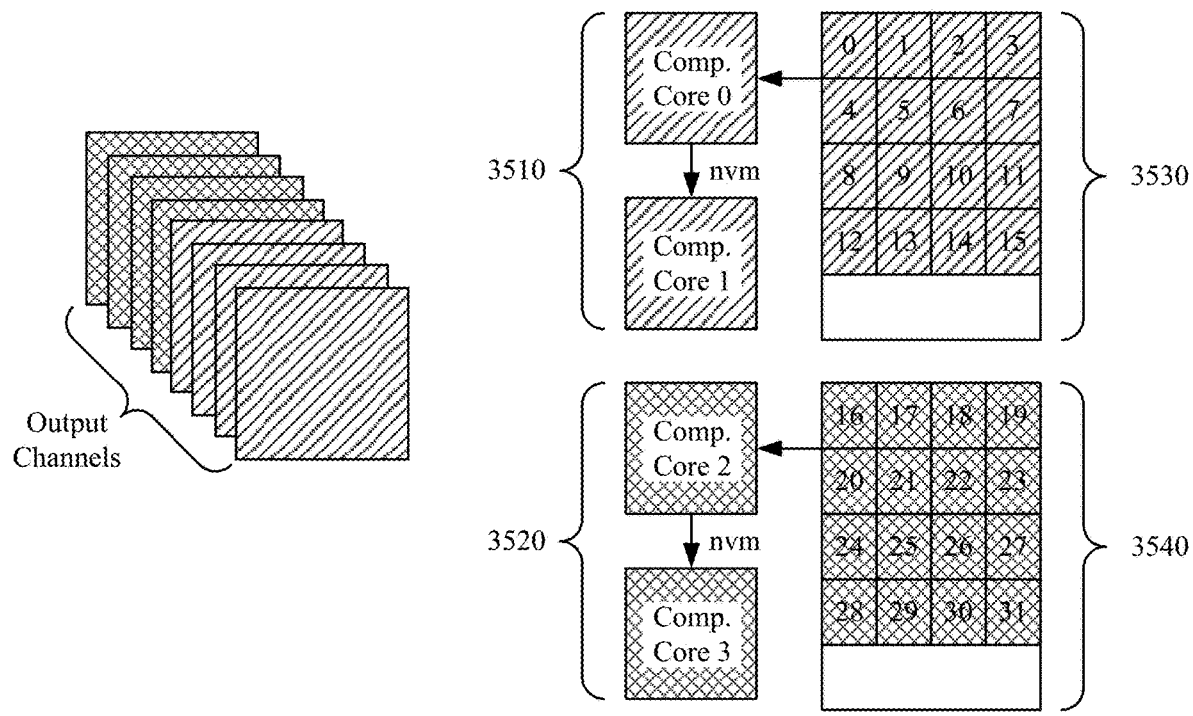
FIG. 35 shows a compound computer core configuration, in accordance with aspects of the present technology.

In another example, the compound configuration can be utilized to distribute pixel computing cores over multiple macros of the second memory region, as illustrated in FIG. 35. In such a configuration, each set of compute cores 3510, 3520 can access respective macros of the second memory region 3530, 3540. Compound clusters can be utilized when a second memory region polymorphic compute core configuration cannot be utilized. Generally, if both sets of compute cores can be used to share data from the second memory region between the compute cores of both sets, the second memory region polymorphic compute core configuration will provide for better data reuse.

Figure 36:
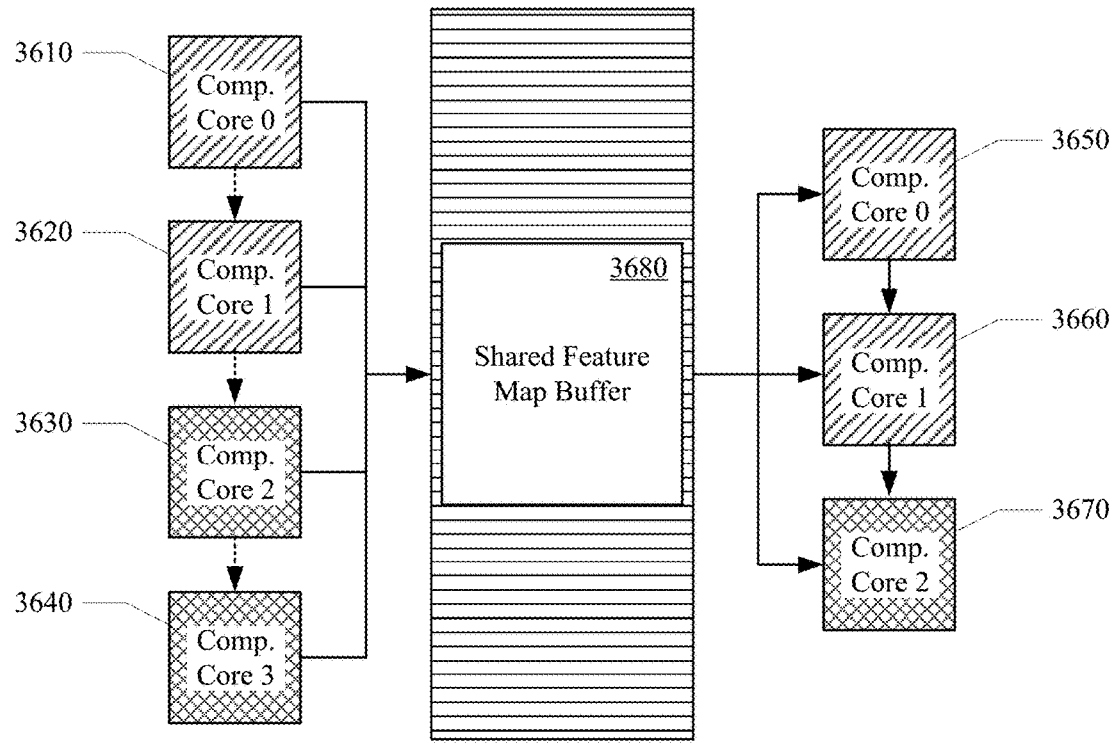
FIG. 36 shows a first memory region sharing feature of the memory processing unit (MPU), in accordance with aspects of the present technology.

Referring now to FIG. 36, a first memory region sharing feature of the memory processing unit (MPU), in accordance with aspects of the present technology, is shown. As illustrated, the dataflow of computations by the MPU can be visualized as a series of produces 3610-3640 and consumers 3650-3670. For example, a compute core cluster 3610-3640 can consume input feature map data from a first portion of the first memory region and produce feature map data that can be an input to a next compute core cluster 3650-3670 to use. It is to be appreciated that data sharing in general between conventional computing units tends to be a significant obstacle to conventional dataflow accelerators. Therefore, conventional processing units may utilize network-on-chip and or data duplications. In contrast, the MPU in accordance with aspects of the present technology enables a much simpler data sharing technique, wherein produces and consumers write and read to a shared memory buffer 3680. The buffers 3680 are interleaved portions of the first memory between the plurality of processing regions. Accordingly, data can flow between clusters in the same processing region and or adjacent processing regions. In one implementation, a software layer can be configured to organize the clusters to ensure such adjacency. In the example of FIG. 36, two compute core clusters 3610-3640 and 3650-3670 in two different processing regions share a buffer 3680 in a portion of the first processing region. It is to be appreciated that there is no direct communication between the producer and the consumer compute cores. Compute cores in a compute cluster do not directly synchronize with each other. However, compute cores in a compute cluster can be configured to directly communicate data with each other.

In one implementation, data can be shared between processing regions by assigning a large enough buffer in the corresponding portion of the first memory. For example, the buffer can be allocated to carry a whole feature map shared between adjacent processing regions. The size of the buffer can be calculated in accordance with Equation 1:

$$S_b = \Sigma_{\forall i} F[i] \quad (1)$$

where F is the vector of the feature map size.

Figures 37A, 37B:
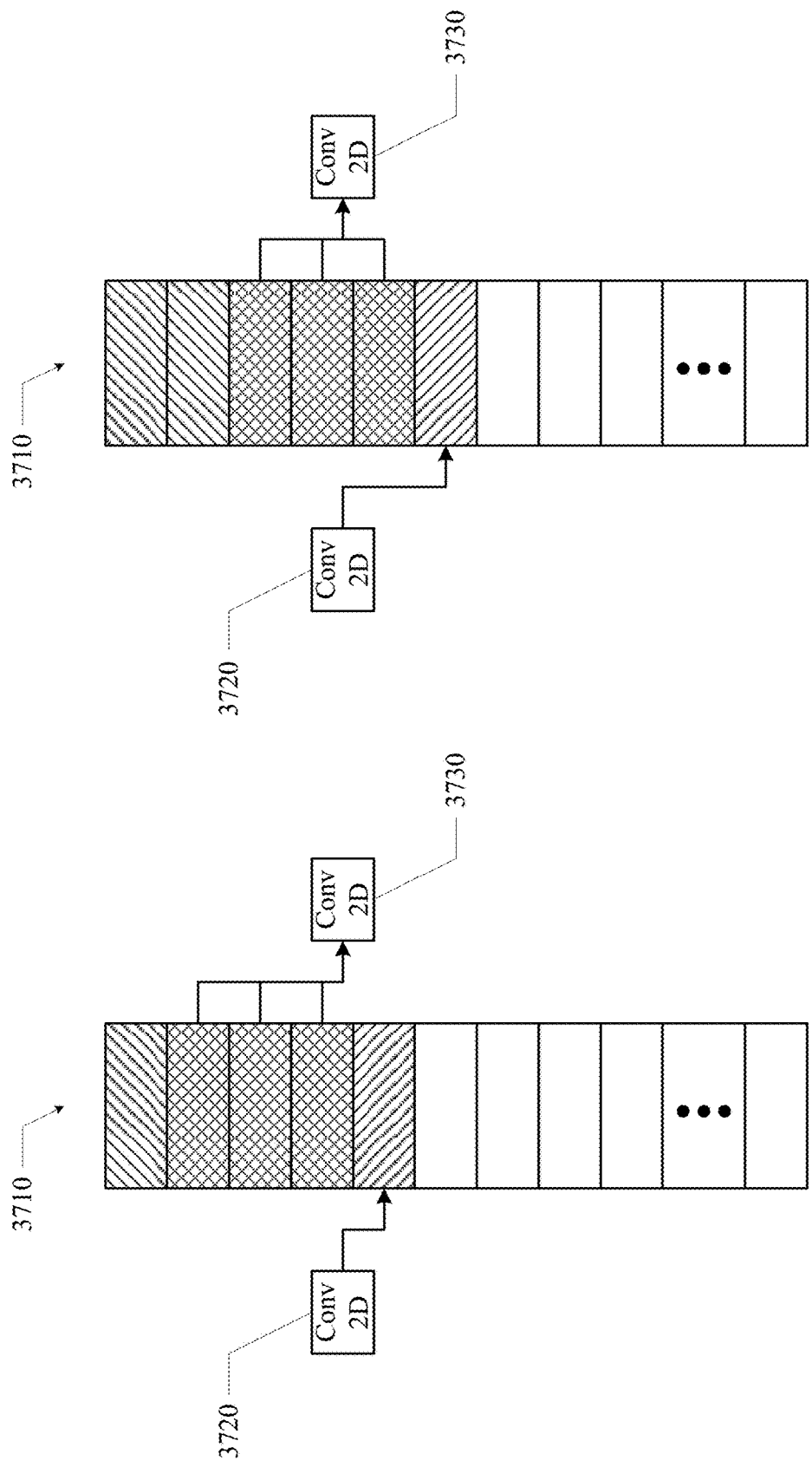
FIGS. 37A and 37B illustrate an exemplary buffer utilization by a consumer and a producer, in accordance with aspects of the present technology.

However, assigning the whole feature map size as a buffer is not enough for the data to flow. Consumers need to avoid reading a buffer entry that is not filled yet by the producer. Assuming a coarse-grain synchronization of the feature map row level, the consumer cannot read from a feature map row that is still being produced. For the sake of simplicity, each feature map row will be illustrated as a single buffer entry in FIGS. 37-42. However, it is appreciated that a single row may require the storage of hundreds, thousands, or even more entries. Referring now to FIGS. 37A and 37B, an exemplary buffer utilization by a consumer and a producer is illustrates. The illustrated buffer 3710 is sized to store a full feature map. The producer 3720, for example, can be performing a two-dimensional convolution, and the consumer 3730 can be performing a two-dimensional convolution having a 3×3 kernel size. The producer core 3720 can generate the pixels of a given feature map row before producing the pixels of a next row. In such case, the producer core 3720 only blocks a single row entry as illustrated in FIG. 37A. As the producer core 3720 generates the pixels of a given feature map row, the consumer core 3730 can access the pixels values of the previous three rows. After the producer core 3720 is done generating the pixels of the given row, the producer core 3720 can move to generate the pixels of the next row as illustrated in FIG. 37B. At that point, the consumer core 3730 can shift its consumption to a next three row window if the consumer core 3730 is ready to start processing the next three row window. Furthermore, it is noted that the rows that have already been consumed can remain in the buffer 3710 until overwritten by the producer core 3720 as processing continues. It is appreciated that the consumer 3730 of a 3×3 kernel consumes three buffer entries simultaneously while the producer 3720 generates data for one entry before moving to the next one. Furthermore, a number of entries in the buffer 3710 are not in use at any given time. Therefore, the full feature map sized buffer 3710 can waste resources in the memory processing unit (MPU).

In another implementation, a smaller partial buffer can be sufficient for the dataflow to support the computations. For example, a circular queue can be utilized as a partial buffer. The partial buffer can be configured to carry enough data for the consumer to operate and have extra entries to allow the producer to generate data while the consumer is working. For example, the partial buffer can include three feature map rows in the case where the consumer is performing a convolution having a 3×3 kernel size. The partial buffer can also include extra entries, referred to as a pipeline margin. Without such a margin, the dataflow performance will degrade significantly since the producer and consumer will not be able to work concurrently. The producer also cannot overwrite data that is not yet consumed, and the consumer needs to wait for the producer to finish writing a new row in the partial buffer before starting to consume it. Referring now to FIGS. 38A-38D, an exemplary shared partial buffer 3810 for a 3×3 kernel size is illustrated. As illustrated, a producer 3820 generates pixel data for a given row before moving on to the next row, and the consumer 3830 accesses three rows of data at a time. By utilizing a partial buffer 3810, the size of the shared buffer 3810 can be reduced to as little as four rows. For example, in a first cycle the consumer 3830 can be accessing the first three rows of pixel data, and the producer 3820 can be generating data for storing in the fourth row. In a second cycle, the consumer 3830 can be accessing the second through four rows of data, while the producer 3820 is storing data in the first row. In a third cycle, the consumer 3830 can access data in the third, fourth and first rows, while the producer 3820 stores data in the second row. In a fourth cycle, the consumer 3830 can access the fourth, first and second rows, while the producer 3820 stores data in the third row. Thereafter, the first through fourth cycles can be iteratively repeated any number of times. Accordingly, the four-row shared partial buffer can allow the producer and consumer to work smoothly.

Figure 39B:
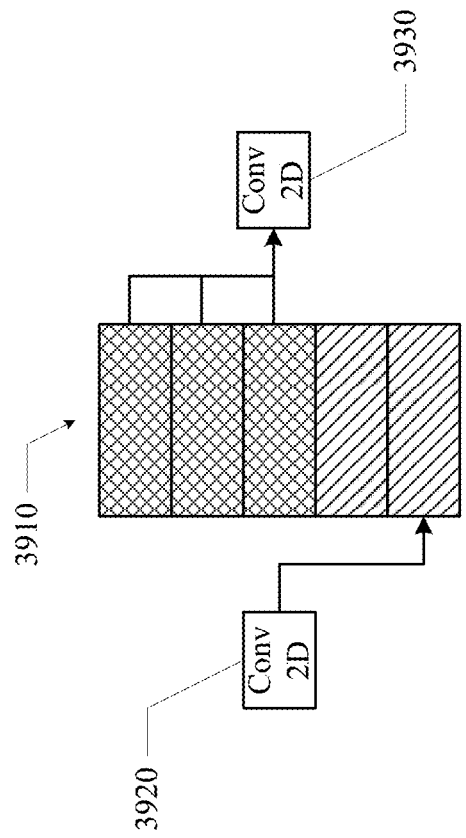
FIGS. 39A and 39B illustrate an exemplary shared partial buffer for a 3×3 kernel size with a 2×2 stride, in accordance with aspects of the present technology.
Figure 39A:
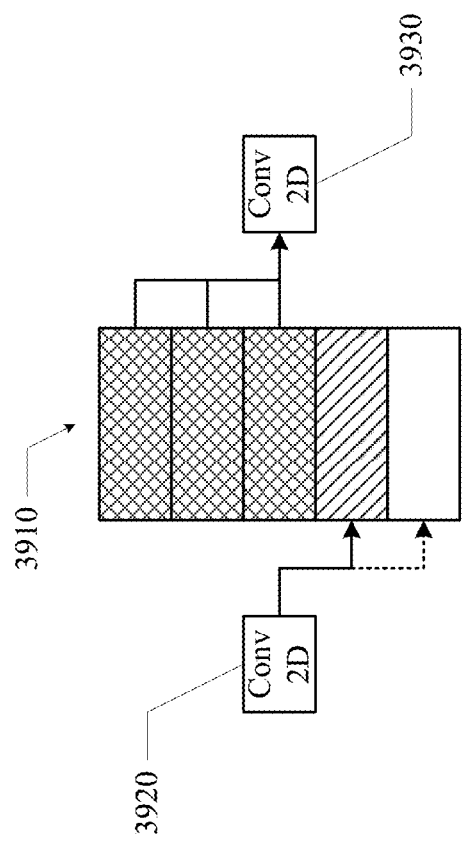

Referring now to FIGS. 39A and 39B, an exemplary shared partial buffer for a 3×3 kernel size with a 2×2 stride is illustrated. A consumer 3930 having a stride of 2 moves its window two rows at a time. Therefore, a pipeline margin of two is needed to allow the producer to generate the necessary rows for the consumer window shift. For example, a producer 3920 can store data in a fourth and fifth row, while the consumer 3930 accesses data in the first through third rows. After the producer 3920 stores data in the fourth and fifth rows, the consumer 3930 can move to access data in the third through fifth rows, while the producer 3920 stores data in the first and second rows.

Figure 40:
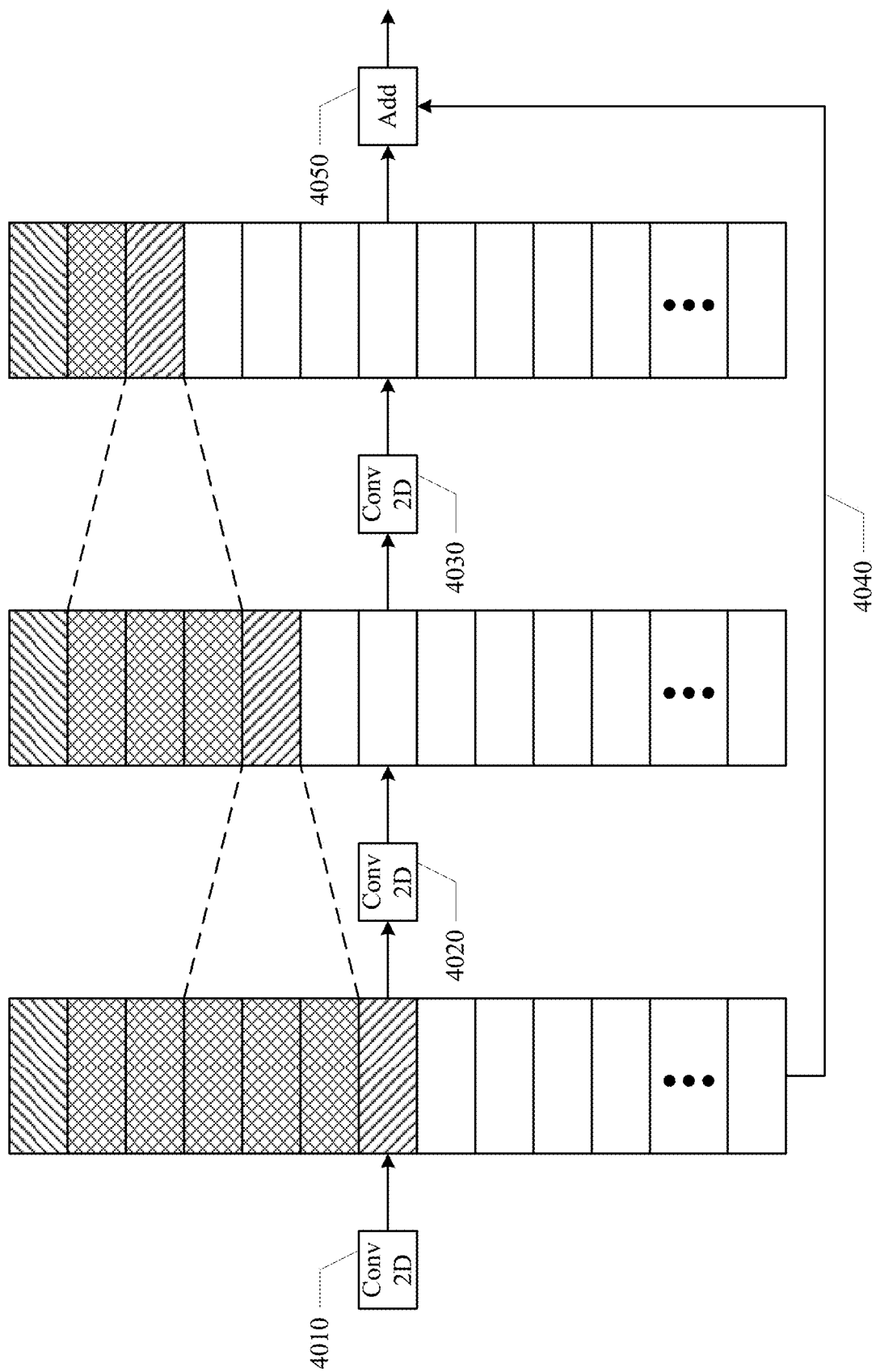
FIG. 40 illustrates an example branching dataflow utilizing a full feature-map buffer, in accordance with aspects of the present technology.

For ease of explanation, aspects of the present technology have been described with regard to a single producing cluster and a single consuming cluster. However, dataflow in the memory processing unit (MPU) can involve dataflow branching into multiple paths that can for example end as different outputs, merge again, and the like. While branching output can be treated the same as multiple single dataflow paths, merging branches can involve additional considerations. If a neural network with merging branches, for example, is not allocated the correct buffer size, the dataflow pipeline might end up in a deadlock or produce incorrect data. With data having multiple consumers, the data validity should be set by the slowest consumer. Typically, a longer data lifetime results in a need for a larger buffer size. Referring now to FIG. 40, an example branching dataflow utilizing a full feature-map buffer is illustrated. As illustrated, a first producer 4010 can perform a convolution (Conv2D) operation, which is consumed by two branches. A first branch, can for example, include a series of two convolution (Conv2D) operations 4020, 4030 of a kernel size of 3×3. A second branch can include a skip connection 4040, for example. The two branches can then be merged together, for example, with the aid of an addition (Add) operation 4050. Each of the convolution (Conv2D) operations 4020, 4030 in the first branch need three ready rows to access for input data. In addition, an extra row is also needed as a pipeline margin. The add operation 4050 does not have any kernels and therefore only needs a single ready row to operate. However, the producer data cannot be outdated based on the convolution (Conv2D) consumers 4020, 4030. Data needs to stay in the buffer until the Add merge node 4050 is ready to use it.

Figure 41:
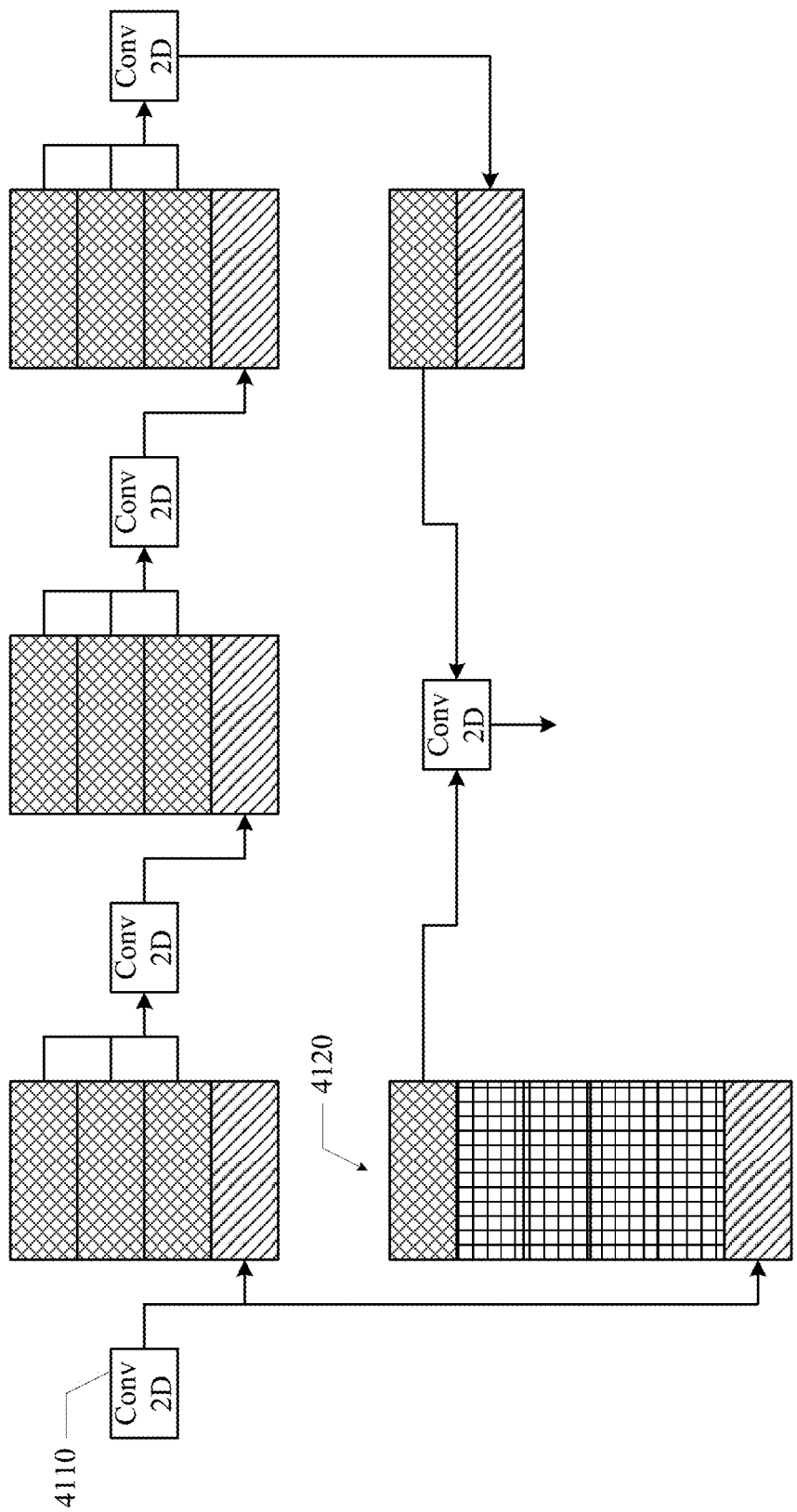
FIG. 41 illustrates an exemplary branching dataflow utilizing a partial feature-map buffer, in accordance aspects of the present technology.
Figure 42:
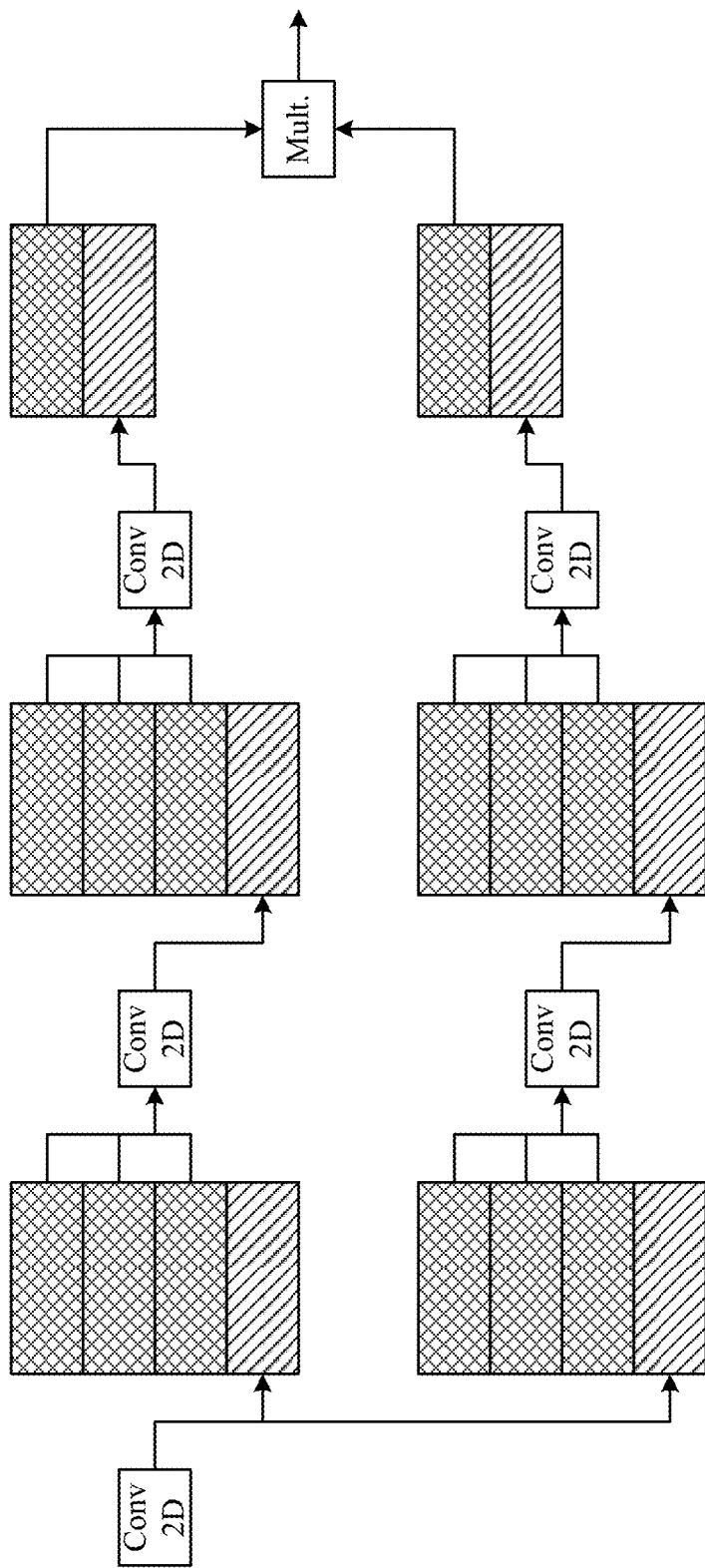
FIG. 42 illustrates an exemplary branching dataflow utilizing a partial feature-map buffer, in accordance aspects of the present technology.

Referring now to FIG. 41, an exemplary branching dataflow utilizing a partial feature-map buffer is illustrated. As illustrated, the producer 4110 at the start of the branch produces two sets of data for consumers (with the aid of bypass operations) of the two branches to facilitate data synchronization. The faster branch is configured to buffer 4120 to store more data to align with the slower branch, which can be referred to as the branch delay data. It is to be appreciated that not all branches require a delay buffer. For example, balanced branches do not require extra data storage, as illustrated in FIG. 42. As illustrated, each of the two branches can be configured with a typical size of partial buffer as if each branch is the only data path.

Figure 43A:
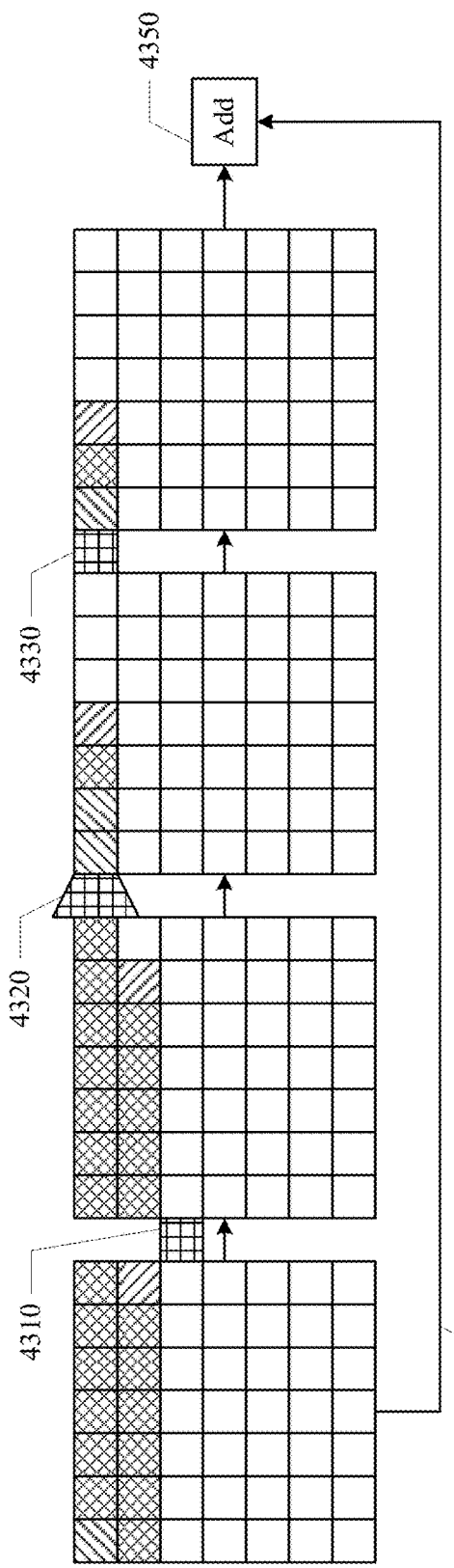
FIGS. 43A and 43B illustrate pixel synchronization in a shared buffer, in accordance with aspects of the present technology.
Figure 43B:
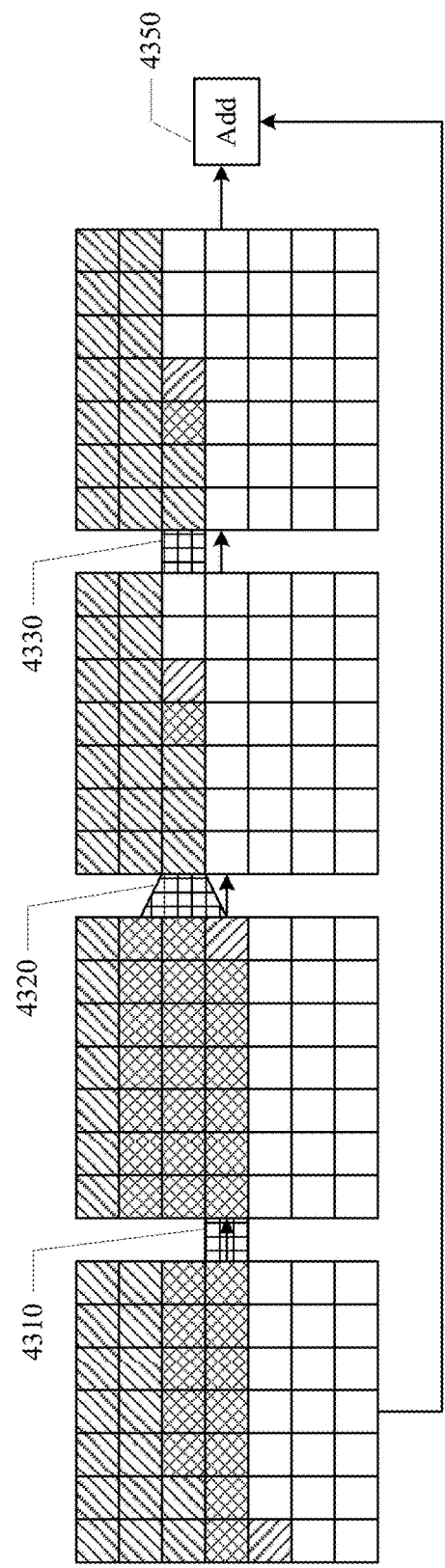

Although the shared buffer can be synchronized on a row-wise basis as described above, the shared buffer can also be synchronized on other granularities. For example, a shared buffer in the first memory region can also be synchronized on pixel basis as illustrated in FIGS. 43A and 43B. As illustrated, a producer can perform a convolution (Conv2D) operation, which is consumed by two branches. The first branch can be made of three convolution (Conv2D) operations 4310-4330 in series, two of which can have a kernel size of 1×1 while the other has a 3×3 kernel size. The second branch 4340 can be a skip connection. The two branches can merge together at an addition (ADD) operation 4350. The 1×1 kernel size convolution (Conv2D) operations 4310, 4330 can utilize a two pixel buffer size, while the 3×3 convolution (Conv2D) operations can utilize at least three rows. It should be noted that the pixels can consume multiple buffer entries based on the number of output channels.

Coarse grain synchronization can offer less overhead and pipeline stalls. In contrast, fine-grain buffer entries can reduce the required buffer size at the expense of synchronization steps. The buffer reduction can be noticeable in the case of kernel-less operation and 1×1 kernels. However, in the case of larger kernels, the gains for the fine grain configurations tend to be smaller. The gain can almost diminish in striding, fused pooling, multi-row producer and the like configurations. In general, the granularity of the synchronization can be a design choice rather than a property of the architecture.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A memory processing unit (MPU) comprising:
   a first memory including a plurality of regions;
   a plurality of processing regions interleaved between the plurality of regions of the first memory, wherein the processing regions includes a plurality of compute cores, wherein each of the plurality of compute cores of each respective one of the plurality of processing regions are coupled between adjacent ones of the first plurality of memory regions; and one or more inter-layer communication (ILC) modules communicatively coupled to the plurality of compute cores in each of the plurality of processing regions, wherein the one or more ILC modules are configurable to control communication between compute cores through corresponding adjacent ones of the plurality of regions of the first memory, wherein the control of the communication includes;

a given one of the one or more ILC modules configured to receive a request form a given compute core to access a given region of the first memory; and the given one of the one or more ILC modules configured to block or allow access by the given compute core to the given region of the first memory based on a count associated with the given region of the first memory in response to the received request.

2. The MPU of claim 1, wherein the one or more ILC modules comprise one ILC module communicatively coupled to the plurality of compute cores in the plurality of processing regions and associated with the plurality of regions of the first memory and configurable to control communication between compute cores through corresponding adjacent ones of the plurality of regions of the first memory.

3. The MPU of claim 1, wherein the one or more ILC modules comprise a plurality of ILC modules, wherein respective ones of the plurality of ILC modules are associated with respective one of the plurality of regions of the first memory, wherein each respective ILC module is communicatively coupled the plurality of compute cores in the processing regions adjacent the respective associated region of the first memory and configurable to control communication between the plurality of compute cores in the processing regions adjacent the respective associated region of the first memory through the respective associated region of the first memory.

4. The MPU of claim 1, wherein control of the communication between compute cores through corresponding adjacent ones of the plurality of regions of the first memory by the one or more ILC modules comprises an indirect-invisible synchronization mode.

5. The MPU of claim 1, wherein control of the communication between compute cores through corresponding adjacent ones of the plurality of regions of the first memory by the one or more ILC modules further comprises:

mapping an identifier of the given compute core in the received request to the count associated with the given region of the first memory.

6. The MPU of claim 1, wherein the request from the given compute core to access the given region of the first memory comprises a fetch request.

7. The MPU of claim 1, wherein the request from the given compute core to access the given region of the first memory comprises a writeback request.

8. A memory processing unit (MPU) comprising:

a first memory including a plurality of regions;

a plurality of processing regions interleaved between the plurality of regions of the first memory, wherein the processing regions includes a plurality of compute cores, wherein each of the plurality of compute cores of each respective one of the plurality of processing regions are coupled between adjacent ones of the first plurality of memory regions; and one or more inter-layer communication (ILC) modules communicatively coupled to the plurality of compute cores in each of the plurality of processing regions, wherein the one or more ILC modules are configurable to control communication between compute cores through corresponding adjacent ones of the plurality of regions of the first memory, wherein the control of the communication includes;

the one or more ILC modules configured to receive a request from the given compute core to write to the given region of the first memory;

the one or more ILC modules configured to allow the given compute core to write to the given region of the first memory and increment a count, when the count is less than a first predetermined level; and the one or more ILC modules configured to block the given compute core from writing to the given region of the first memory and not incrementing the count, when the count is equal to the first predetermined level.

9. The MPU of claim 8, wherein control of the communication between compute cores through corresponding adjacent ones of the plurality of regions of the first memory by the one or more ILC modules further comprises:

the one or more ILC modules configured to receive a request from the given compute core to fetch from the given region of the first memory;

the one or more ILC modules configured to allow the given compute core to fetch from the given region of the first memory and decrement the count, when the count is greater than a second predetermined level; and the one or more ILC modules configured to block the given compute core from fetching from the given region of the first memory and not decrementing the count, when the count is equal to the second predetermined level.

10. The MPU of claim 8, wherein control of the communication between compute cores through corresponding adjacent ones of the plurality of regions of the first memory by the one or more ILC modules further comprises:

resetting the count in response to a start of a new frame of data.

* * * * *